US008686426B2

(12) United States Patent
Ahn et al.

(10) Patent No.: US 8,686,426 B2
(45) Date of Patent: Apr. 1, 2014

(54) THIN FILM TRANSISTOR HAVING PLURAL SEMICONDUCTIVE OXIDES, THIN FILM TRANSISTOR ARRAY PANEL AND DISPLAY DEVICE INCLUDING THE SAME, AND MANUFACTURING METHOD OF THIN FILM TRANSISTOR

(75) Inventors: Byung Du Ahn, Hwaseong-si (KR); Ji Hun Lim, Goyang-si (KR); Gun Hee Kim, Hwaseong-si (KR); Kyoung Won Lee, Ansan-si (KR); Je Hun Lee, Seoul (KR)

(73) Assignees: Samsung Display Co., Ltd. (KR); Kobe Steel, Ltd. (JP)

( * ) Notice: Subject to any disclaimer, the term of this patent is extended or adjusted under 35 U.S.C. 154(b) by 0 days.

(21) Appl. No.: 13/555,889

(22) Filed: Jul. 23, 2012

(65) Prior Publication Data

US 2013/0256653 A1 Oct. 3, 2013

(30) Foreign Application Priority Data

Apr. 2, 2012 (KR) ........................ 10-2012-0034101

(51) Int. Cl.
*H01L 27/14* (2006.01)

(52) U.S. Cl.
USPC ................................ 257/72; 257/59; 257/258

(58) Field of Classification Search
USPC .............................................. 257/59, 72, 258
See application file for complete search history.

(56) References Cited

U.S. PATENT DOCUMENTS

| | | |
|---|---|---|
| 5,972,527 A | 10/1999 | Kaijou et al. |
| 6,727,522 B1 | 4/2004 | Kawasaki et al. |
| 6,878,962 B1 | 4/2005 | Kawasaki et al. |
| 7,061,014 B2 | 6/2006 | Hosono et al. |
| 7,067,843 B2 | 6/2006 | Carcia et al. |
| 7,145,174 B2 | 12/2006 | Chiang et al. |
| 7,189,992 B2 | 3/2007 | Wager, III et al. |
| 7,211,825 B2 | 5/2007 | Shih et al |
| 7,242,039 B2 | 7/2007 | Hoffman et al. |
| 7,262,463 B2 | 8/2007 | Hoffman |

(Continued)

FOREIGN PATENT DOCUMENTS

| | | |
|---|---|---|
| CN | 101548389 A | 9/2009 |
| CN | 101673770 A | 3/2010 |

(Continued)

OTHER PUBLICATIONS

European Search Report corresponding to European Patent Application No. 12191169.7, Sep. 30, 2013, 6 pages.

*Primary Examiner* — Tan N Tran
(74) *Attorney, Agent, or Firm* — Innovation Counsel LLP

(57) ABSTRACT

A plural semiconductive oxides TFT (sos-TFT) provides improved electrical functionality in terms of charge-carrier mobility and/or threshold voltage variability. The sos-TFT may be used to form a thin film transistor array panel for display devices. An example sos-TFT includes: an insulated gate electrode; a first semiconductive oxide layer having a composition including a first semiconductive oxide; and a second semiconductive oxide layer having a different composition that also includes a semiconductive oxide. The first and second semiconductive oxide layers have respective channel regions that are capacitively influenced by a control voltage applied to the gate electrode. In one embodiment, the second semiconductive oxide layer includes at least one additional element that is not included in the first semiconductive oxide layer where the additional element is one of gallium (Ga), silicon (Si), niobium (Nb), hafnium (Hf), and germanium (Ge).

42 Claims, 20 Drawing Sheets

(56) References Cited

U.S. PATENT DOCUMENTS

| | | |
|---|---|---|
| 7,297,977 B2 | 11/2007 | Hoffman et al. |
| 7,339,187 B2 | 3/2008 | Wager, III et al. |
| 7,393,600 B2 | 7/2008 | Inoue et al. |
| 7,564,055 B2 | 7/2009 | Hoffman |
| 2005/0017244 A1 | 1/2005 | Hoffman et al. |
| 2006/0108636 A1 | 5/2006 | Sano et al. |
| 2006/0113536 A1 | 6/2006 | Kumomi et al. |
| 2006/0113549 A1 | 6/2006 | Den et al. |
| 2006/0113565 A1 | 6/2006 | Abe et al. |
| 2007/0023750 A1 | 2/2007 | Chiang et al. |
| 2007/0052025 A1 | 3/2007 | Yabuta |
| 2007/0194379 A1 | 8/2007 | Hosono et al. |
| 2008/0254569 A1 | 10/2008 | Hoffman et al. |
| 2009/0090914 A1 | 4/2009 | Yano et al. |
| 2009/0189153 A1 | 7/2009 | Iwasaki et al. |
| 2009/0236596 A1 | 9/2009 | Itai |
| 2009/0267064 A1 | 10/2009 | Yano et al. |
| 2009/0278122 A1 | 11/2009 | Hosono et al. |
| 2009/0280600 A1 | 11/2009 | Hosono et al. |
| 2010/0038641 A1 | 2/2010 | Imai |
| 2010/0059746 A1 | 3/2010 | Itai et al. |
| 2011/0215328 A1* | 9/2011 | Morosawa et al. ............ 257/59 |
| 2011/0227064 A1 | 9/2011 | Park et al. |
| 2012/0012840 A1 | 1/2012 | Korthuis et al. |
| 2013/0032798 A1 | 2/2013 | Miki et al. |

FOREIGN PATENT DOCUMENTS

| | | |
|---|---|---|
| EP | 2092569 | 6/2008 |
| EP | 2161756 A1 | 3/2010 |
| JP | 05-251705 A | 9/1993 |
| JP | 2008-166716 A | 7/2008 |
| JP | 4164562 B2 | 8/2008 |
| JP | 4170454 B2 | 8/2008 |
| JP | 2009-099944 A | 5/2009 |
| JP | 2009-123957 A | 6/2009 |
| JP | 2009-135380 A | 6/2009 |
| JP | 2010-045263 A | 2/2010 |
| JP | 2010-067710 A | 3/2010 |
| JP | 2010-067954 A | 3/2010 |
| JP | 2011132644 | 10/2011 |
| KR | 1020080069607 | 7/2008 |
| KR | 1020090089444 A | 8/2009 |
| KR | 1020090089450 A | 8/2009 |
| KR | 102009010828 A | 9/2009 |
| KR | 10 1052241 | 7/2011 |
| KR | 1020110124530 A | 11/2011 |
| KR | 1020110128038 A | 11/2011 |
| WO | 03/040441 A1 | 5/2003 |
| WO | 2007/032294 A1 | 3/2007 |
| WO | 2008/069056 A1 | 6/2008 |
| WO | 2008/069255 A1 | 6/2008 |
| WO | 2009/041544 A1 | 4/2009 |
| WO | 2011132644 | 10/2011 |

* cited by examiner

THIN FILM TRANSISTOR HAVING PLURAL SEMICONDUCTIVE OXIDES, THIN FILM TRANSISTOR ARRAY PANEL AND DISPLAY DEVICE INCLUDING THE SAME, AND MANUFACTURING METHOD OF THIN FILM TRANSISTOR

CROSS-REFERENCE TO RELATED APPLICATION

This application claims priority to and the benefit of Korean Patent Application No. 10-2012-0034101 filed in the Korean Intellectual Property Office on Apr. 2, 2012, the entire contents of which application are incorporated herein by reference.

BACKGROUND (a) Field of Disclosure

The present disclosure of invention relates to a thin film transistor (TFT), a thin film transistor array (TFT array) panel and a display device including the same, and a manufacturing method of a thin film transistor, and in detail, to a thin film transistor including an semiconductive oxide, a thin film transistor array panel and a display device including the same, and a manufacturing method of a thin film transistor.

(b) Description of Related Technology

Electric elements such as resistors, capacitors, diodes, and thin film transistors (TFT) are used in various fields. Among these, the thin film transistors (TFT) in particular is often used for defining switching and driving elements in a flat panel display apparatus such as a liquid crystal display (LCD), an organic light emitting device (organic light emitting diode (OLED) display), and an electrophoretic display.

Within the structure of the TFT, the semiconductive portion thereof is an important part for determining behavior characteristics of the TFT. Currently, silicon (Si) is widely used as the semiconductor in the TFT and other electric elements that need a semiconductive portion. The utilized silicon may be an amorphous silicon or a polysilicon type or a monocrystalline depending on the crystallization micro-structure of the semi-conductive material. Monocrystalline silicon tends to be the most difficult to mass produce whereas the amorphous silicon type has a comparatively simpler manufacturing process. However, the amorphous silicon type has a comparatively and undesirably low, charge-carrier mobility such that there is a limit to using it for manufacturing a high performance (e.g., high switching speed) thin film transistor. Between the relatively poor performance of the amorphous silicon type and the relatively superior performance of the monocrystalline silicon type, there is the polysilicon type which has a higher charge-carrier mobility than that of amorphous silicon. However, the process of crystallizing amorphous silicon to convert it to polysilicon form consumes time and energy and has relatively high manufacturing cost. Also because the crystallizing step increases process complexity, more things can go wrong during mass production that employs such a crystallizing step.

In view of this, semiconductive oxides which use a metal oxide having semiconductive properties are coming into favor. These can have a lower cost and higher uniformity as compared with polycrystalline silicon as well as higher charge-carrier mobility and a relatively high ON/OFF ratio as between intended current flow and unintended leakage current flow as compared with amorphous silicon.

The electrical characteristics of thin film transistors of the semiconductive oxide type may be greatly affected by the micro-structure and uniformity of the semiconductive oxide material, where the latter may be functions of the process used to make the semiconductive oxide material. Accordingly, research on the micro-structure and the process of forming thin film transistors using the semiconductive oxide material has been ongoing.

It is to be understood that this background of the technology section is intended to provide useful background for understanding the here disclosed technology and as such, the technology background section may include ideas, concepts or recognitions that were not part of what was known or appreciated by those skilled in the pertinent art prior to corresponding invention dates of subject matter disclosed herein.

SUMMARY

The present disclosure of invention provides for improved electric characteristics by providing a thin film transistor that includes plural semiconductive oxides (hereafter also "sos-TFT", where "sos" represents the plural Semiconductive OxideS) as opposed to a single semiconductive oxide transistor (hereafter also "sso-TFT", where "sso" represents the Single Semiconductive Oxide composition). The present disclosure of invention also provides for an easy manufacturing process for such semiconductive oxides transistors (sos-TFT's).

More specifically, a semiconductive oxides TFT (sos-TFT) in accordance with the present disclosure includes: a gate electrode; a gate insulating layer positioned on or under the gate electrode; a first semiconductive oxide layer and a second semiconductive oxide layer both of which are overlapped by the gate electrode with the gate insulating layer being interposed there between. The first and second semiconductive oxide layers contact each other. A source electrode is connected to the second semiconductive oxide layer and so too is a spaced apart drain electrode. The second semiconductive oxide layer includes at least one additional element that is not included in the first semiconductive oxide layer. The at least one additional element is selected from the group consisting of gallium (Ga), silicon (Si), niobium (Nb), hafnium (Hf), and germanium (Ge).

A thin film transistor array panel in accordance with the present disclosure includes a plurality of semiconductive oxides TFT's (sos-TFT's) formed as a matrix and operatively coupled to respective ones of crossing gate lines and data lines where the sos-TFT's each couple to a corresponding pixel unit (e.g., an LCD pixel electrode).

A display device in accordance with the present disclosure includes the thin film transistor array panel where the latter is configured to define an image by controlling corresponding pixel unit by way of their respective semiconductive oxides TFT's (sos-TFT's).

A content of the additional element of the second semiconductive oxide may be in a range from about 1 at. % to about 30 at. %.

The first semiconductive oxide may include an indium(In)-zinc(Zn)-tin(Sn) oxide (IZTO), and the second semiconductive oxide may include a zinc(Zn)-tin(Sn) oxide (ZTO).

The first semiconductive oxide and the second semiconductive oxide may be each be capable of being etched by a predetermined wet etchant, where a difference between respective etch rates of the first and second semiconductive oxides when wet etched by the predetermined etchant is be equal to or less than about 100 Å/s.

A difference between a content of tin (Sn) of the second semiconductive oxide and a content of tin (Sn) of the first semiconductive oxide may be equal to or less than about 15 at. %.

A thickness of each of the first second semiconductive oxide layers may be in a range from about 5 Å to about 600 Å.

The second semiconductive oxide may include indium (In).

A manufacturing method of a thin film transistor according to an exemplary embodiment of the present disclosure includes: sputtering a first semiconductive oxide target which includes an indium(In)-zinc(Zn)-tin(Sn) oxide to thereby deposit a first semiconductive oxide layer; sputtering a second semiconductive oxide target including a zinc(Zn)-tin(Sn) oxide (ZTO) and also including an additional element not included in the first semiconductive oxide target where that additional element is at least one of gallium, silicon, niobium, hafnium and germanium to thereby deposit a second semiconductive oxide layer overlapping and contacting the first semiconductive oxide layer; and etching the first and second semiconductive oxide layers in a one step etching process to thereby form first and second patterned semiconductive oxide layers of the corresponding semiconductive oxides TFT (sos-TFT).

The etching of the first semiconductive oxide layer and the second semiconductive oxide layer may comprise simultaneously etching both using a same etchant where a difference between etch rates of the first semiconductive oxide and the second semiconductive oxide for the same etchant may be equal to or less than about 100 Å/s.

A difference between a content of tin (Sn) included in the second semiconductive oxide layer and a content of tin (Sn) included in the first semiconductive oxide layer may be equal to or less than about 15 at. %.

A content of the additional element may be in a range from about 1 at. % to about 30 at. %.

According to an exemplary embodiment of the present disclosure, the electrical characteristics of the semiconductive oxides TFT (sos-TFT) including the plural semiconductive oxides may be improved as compared to a semiconductive oxide TFT having only one same semiconductive oxide.

DETAILED DESCRIPTION

Figure 1:
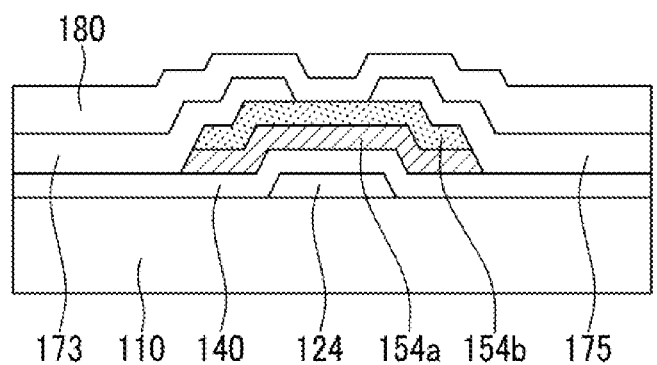
FIG. 1 is a cross-sectional view of a plural semiconductive oxides thin film transistor (sos-TFT) according to an exemplary embodiment in accordance with the present disclosure.

The present disclosure of invention will be described more fully hereinafter with reference to the accompanying drawings, in which exemplary embodiments of the disclosure are shown. As those skilled in the pertinent art would realize after appreciating the present disclosure, the described embodiments may be modified in various different ways, all without departing from the spirit or scope of the teachings of the present disclosure.

In the drawings, the thickness of layers, films, panels, regions, etc., may be exaggerated for clarity. (One exception is the included micrographs which are to scale.) Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Firstly, a thin film transistor according to an exemplary embodiment of the present disclosure will be described with reference to FIG. 1, FIG. 2, and FIG. 3.

Figure 2:
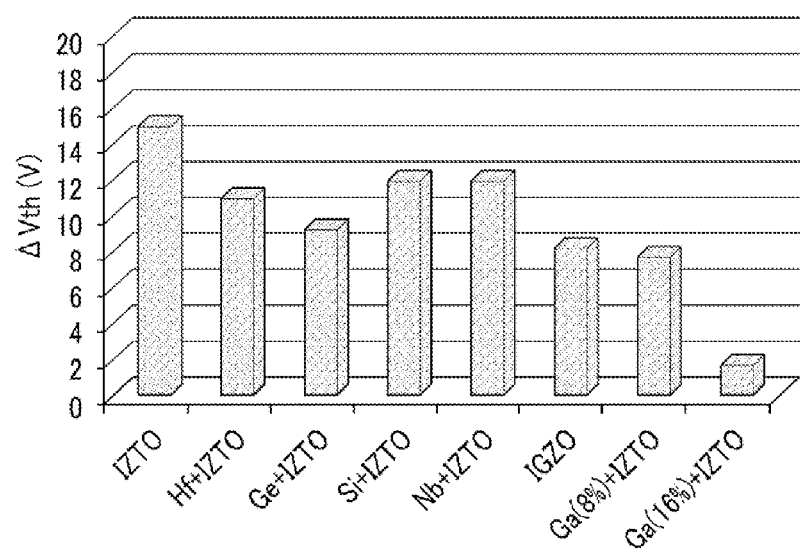
FIG. 2 is a bar graph showing respective photoelectronic reliabilities of thin film transistors made according to various exemplary embodiments including those for semiconductive oxides TFT's (sos-TFT's) of the present disclosure.
Figure 3:
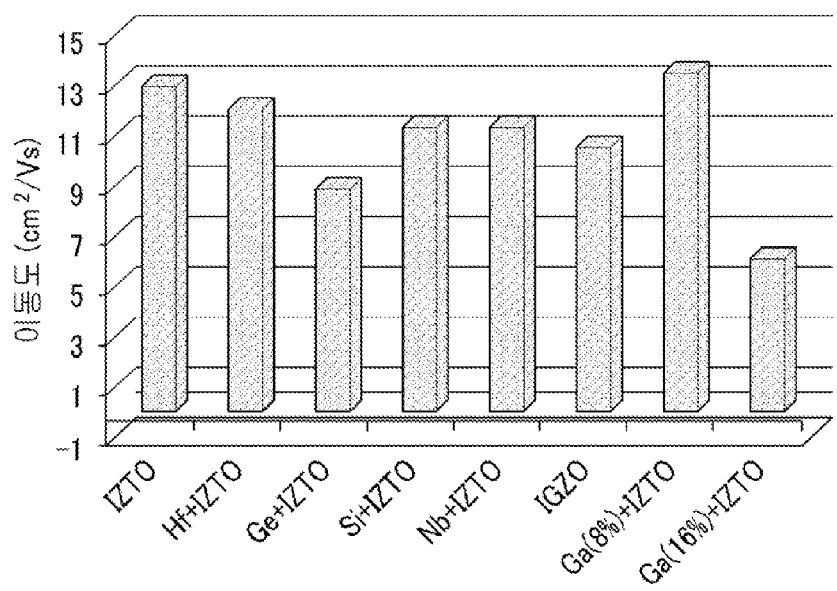
FIG. 3 is a bar graph showing respective charge-carrier mobilities of thin film transistors made according to various exemplary embodiments including those for semiconductive oxides TFT's (sos-TFT's) of the present disclosure.

FIG. 1 is a cross-sectional view of a thin film transistor according to an exemplary embodiment of the present disclosure, FIG. 2 is a graph showing photoelectronic reliability of different thin film transistors formed according to various exemplary embodiments of the present disclosure, and FIG. 3 is a graph of charge carrier mobility of thin film transistors formed according to various exemplary embodiments of the present disclosure.

Referring to the side cross sectional view of FIG. 1, a gate electrode 124 is positioned on a substrate 110 including a relatively transparent insulating material such as plastic or glass. The gate electrode 124 may be made of a conductive material such as an aluminum-based metal of aluminum (Al) or aluminum alloys, a silver-based metal of silver (Ag) or silver alloys, a copper-based metal of copper (Cu) or copper alloys, a molybdenum-based metal of molybdenum (Mo) or molybdenum alloys, chromium (Cr), tantalum (Ta), and titanium (Ti). However, the gate electrode 124 may be made of a multilayered structure including at least two conductive layers having different physical properties. For example, the gate electrode 124 may have a multilayered structure such as Mo/Al/Mo, Mo/Al, Mo/Cu, CuMn/Cu, and Ti/Cu.

A first semiconductive element 154a and a different second semiconductive element 154b are provided. Each of the semiconductive elements, 154a and 154b respectively includes a respective semiconductive oxide. The first semiconductive element 154a overlaps the gate electrode 124 while having a gate insulating layer 140 interposed therebetween. The second semiconductive element 154b overlaps the first one. The first semiconductive element 154a and the second semiconductive element 154b directly contact each other such that they are electrically and physically connected. Here, the first semiconductive element 154a is also referred to as a first semiconductive oxide layer and is understood to have a lower major surface interfacing with a top major surface of the gate insulating layer 140.

In the present exemplary embodiment, the gate insulating layer 140 may be positioned on the gate electrode 124. The gate insulating layer 140 may includes an insulating material such as a silicon oxide (SiOx), a silicon nitride (SiNx), or a silicon oxynitride (SiOxNy). The gate insulating layer 140 may be formed through a sputtering method. In general, and as a result of the sputtering process, the gate insulating layer 140 will typically have an amorphous microstructure.

As mentioned the first semiconductive element 154a and the second semiconductive element 154b are disposed on the gate insulating layer 140. In an exemplary embodiment of the present disclosure shown in FIG. 1, the second semiconductive element 154b is positioned directly on the first semiconductive element 154a, and top plan view shapes (not shown) of the first semiconductive element 154a and the second semiconductive element 154b may be substantially the same or similar to each other in terms of shape. Here, the plan shapes means the shapes seen when showing in a direction of a normal line to the top major surface of the substrate 110.

The respective semiconductive oxides of the first semiconductive element 154a and the second semiconductive element 154b have different compositions. In detail, the second semiconductive element 154b includes at least one additional element, X that is not included in the first semiconductive element 154a. The additional element X comprises at least one of gallium (Ga), silicon (Si), niobium (Nb), hafnium (Hf), and germanium (Ge). Stated otherwise, the first semiconductive element 154a that lies directly on the typically amorphous microstructure of the gate insulating layer 140 is formulated to not include the predetermined, at least one additional element, X, where the latter is included in the second element 154b. Also, the second semiconductive element 154b may or may not include indium (In). Detailed possible compositions of the first semiconductive element 154a and the second semiconductive element 154b will be described below.

According to its various formulations and in accordance with the present disclosure, the first semiconductive element 154a includes an oxide including at least one but more preferably, all of indium (In), tin (Sn), and zinc (Zn) while not including the so-called, X moiety. That is, in a preferred embodiment, the first semiconductive element 154a includes an indium-zinc-tin oxide compound or mixture (IZTO). For example, the first semiconductive element 154a may more specifically include a mixture of the following compounds: indium oxide ($In_2O_3$), zinc oxide (ZnO), and tin oxide ($SnO_2$).

On the other hand, the second semiconductive element 154b includes, as its at least one additional element, X; at least one of gallium (Ga), silicon (Si), niobium (Nb), hafnium (Hf), and germanium (Ge) while optionally not including indium (In) in one case and just including a zinc (Zn)-tin (Sn) oxide mixture (ZTO) as its non-X components. While in one embodiment, the second semiconductive element 154b leaves out the indium, in an alternate embodiment it may include indium (In). More specifically, for one example, the second semiconductive element 154b may include a mixture of indium oxide ($In_2O_3$), zinc oxide (ZnO), tin oxide ($SnO_2$), and gallium oxide ($Ga_2O_3$).

Therefore, according to one aspect of the present disclosure, the second semiconductive element 154b includes at least one of tin-zinc oxide and gallium, silicon, niobium, hafnium, and germanium. The composition of the second semiconductive element 154b may be formed through the use of an AC or DC sputtering process that sputters said composition on top of that of the first semiconductive element 154a while using an appropriate semiconductive oxide target including indium or not including In. At this time, a resistivity of the semiconductive oxide target used for forming the second semiconductive element 154b may be equal to or less than about $5 \times 10^{-2}$ Ωcm. For example, the, AC or DC sputtering process may be performed in an Ar atmosphere, an $O_2$ atmosphere, or a mixed atmosphere of Ar and $O_2$.

When the second semiconductive element 154b includes indium, a content of indium among the constituents forming the second semiconductive element 154b may be substantially the same as a content (at. %) of indium included in the first semiconductive element 154a.

The first semiconductive element 154a and the second semiconductive element 154b according to this composition can be simultaneously wet-etched by an etchant for usable for wet-etching a metal such as copper (Cu). This metal such as copper may be a composition material of wiring that may be deposited after and above the layer of the second semiconductive element 154b.

A difference between etch rates of the first semiconductive element 154a and the second semiconductive element 154b for the etchant may be equal to or less than about 100 Å/s, and more in detail, it may be equal to or less than about 10 Å/s. When the difference between etch rates of the first semiconductive element 154a and the second semiconductive element 154b for the given etchant is more than about 10 Å/s, the edges of the patterned first semiconductive element 154a and second semiconductive element 154b are not well aligned such that a skew may be generated and an undercut may be generated in one of the first semiconductive element 154a and the second semiconductive element 154b, and in a worse case, simultaneous patterning of both of the first semiconductive element 154a and the second semiconductive element 154b may be made impossible in a practical sense. However, according to an exemplary embodiment of the present disclosure, when simultaneously patterning the first semiconductive element 154a and the second semiconductive element 154b through wet-etching with the given etchant, the skew and the undercut to the first semiconductive element 154a and the second semiconductive element 154b may be substantially prevented, thereby allowing for substantial self-aligning of the pattern edges of both to a common mask pattern.

As part of a method for making the difference between the etch rates of the first semiconductive element 154a and the second semiconductive element 154b for the chosen etchant to be equal to or less than about 100 Å/s, a difference between the content of tin (Sn) included in the second semiconductive element 154b and the content of tin (Sn) included in the first semiconductive element 154a may be made equal to or less than about 15 at. %.

According to an exemplary embodiment of the present disclosure, a content of the at least one additional element X included in the second semiconductive element 154b may be in a range from about 1 at. % to about 30 at. %. As described above, a relatively high charge-carrier mobility may be realized while increasing photoelectronic reliability of the thin film transistor by including both of the first semiconductive element 154a and the second semiconductive element 154b for defining a channel portion of the so-TFT. This aspect will be described with reference to FIG. 2 and FIG. 3.

FIG. 2 shows photoelectronic reliability as characterized by a statistically measured deviation (ΔVth) of a threshold voltage (Vth) of corresponding thin film transistors (so-TFT's) made with the composition of the second semiconductive element 154b being as indicated on the X-axis of the bar graph. It is to be understood that as the illustrated statistical deviation (ΔVth) of the threshold voltage of the thin film transistors is decreased, the correspondingly associated photoelectronic reliability is increased. In FIG. 2, IZTO and IGZO are included as comparative examples, and the other illustrated compositions are those of the second semiconductive element 154b which include the additional X factor in accordance with the present disclosure. Referring to FIG. 2, for the illustrated compositions of the second semiconductive element 154b which are in accordance with the present disclosure, the photoelectronic reliability of the thin film transistor (so-TFT) formed this way is relatively excellent as compared with semiconductive oxide transistors (so-TFT's) in general. More specifically, the photoelectronic reliability may be made exceptionally good (smallest deviation and thus best predictability for electrical behavior) when the additional element X is gallium (Ga) and the content of that additional element X (e.g., gallium (Ga)) in the second semiconductive element 154b is increased to about 16 at. %, as compared to cases where the compositional contribution of that additional element X (e.g., gallium (Ga)) is substantially less than 16 at. %. Accordingly, for the sake of providing relatively good predictability for electrical behavior of semiconductive oxide transistors (so-TFT's) where statistical deviation (ΔVth) of the threshold voltage is minimized, it is desirable to use, as an example, the Ga (16 atomic percent)+IZTO composition shown at the far right of the bar graph of FIG. 2.

On the other hand, and as shown in FIG. 3, the same exemplary Ga (16 atomic percent)+IZTO composition shown at the far right of the bar graph of FIG. 3 performs comparatively worst in terms of charge-carrier mobility (cm2/Vs) for test thin film transistors (so-TFT's) made according to the illustrated compositions for their respective second semiconductive elements 154b. Like in the case of FIG. 2, in FIG. 3, the IZTO and IGZO compositions are included as comparative examples, and the rest of the illustrated bars in the graph represent exemplary compositions for the second semiconductive element 154b in accordance with the present disclosure where such compositions include the at least one additional X factor (e.g., gallium (Ga). Referring to the details of FIG. 3, and as seen by for example, comparing the respective charge-carrier mobility values of the semiconductive composition at the far right (ITZO+X=(16 at. % Ga)) and the semiconductive composition at the far left (ITZO with no X additive), it can be seen that the compositions at the far left (ITZO with no X additive) has a substantially superior charge-carrier mobility to that of the composition at the far right (ITZO+(16 at. % Ga)). More specifically, it is observed by comparing the example at the far right (atomic percent of Ga greater than 8%) to the example at the far left (atomic percent of Ga=0%) and the example that is second from the right (atomic percent of Ga=8%) that charge-carrier mobility appears to increase slightly when going from the case of atomic percent of Ga=0% to the case of atomic percent of Ga=8%. On the other hand, charge-carrier mobility appears to decrease substantially when going from the case of atomic percent of Ga=8% to the case of atomic percent of Ga=16%. In other words, the charge-carrier mobility may be undesirably low when the content of the additional element X (e.g., gallium (Ga)) of the second semiconductive element 154b is about 16 at. % or higher. By contrast, the charge-carrier mobility may be acceptable in cases where the content of the additional element X (e.g., Ga) is less than 16 at. %, for example 8 at. % or less.

In view of the above, and in accordance with an exemplary embodiment of the present disclosure, when the second semiconductive element 154b includes at least one additional element X (where the additional element X includes at least one of gallium (Ga), silicon (Si), niobium (Nb), hafnium (Hf), and germanium (Ge)) for the purpose of reducing statistical deviation (ΔVth) of the threshold voltage in accordance with FIG. 2, the first semiconductive element 154a may be formed with substantially less or none of the additional element X for the purpose of increasing the charge-carrier mobility provided by the first semiconductive element 154a. Aside from having a sudden and bright line change in respective compositions between those of the first and second semiconductive elements, 154a and 154b, it is within the contemplation of the present disclosure to provide for a gradual shift or graduated mixing in and out of the respective components of the first and second semiconductive elements, 154a and 154b respectively in the region of the interfacing boundary of the first semiconductive element 154a and the second semiconductive element 154b. Alternatively, in some cases, it may be desirable to have a sudden and bright line change in respective compositions between those of the first and second semiconductive elements, 154a and 154b, and the gradual shift from one composition to the other may be prevented by switching from use of one sputtering target exclusively to that of a second and substantially different sputtering target. Thus, in the latter case, no new intermediate layer is generated having a new and different composition in the boundary portion between the predetermined and respective compositions of the first semiconductive element 154a and the second semiconductive element 154b. Particularly, if the content of at least one additional element X included in the second semiconductive element 154b is in the range from about 1 at. % to about 30 at. %, the mixing of the component elements of the first semiconductive element 154a and the second semiconductive element 154b may be undesirable and may be definitely prevented by switching from exclusive use of a first sputtering target to exclusive use of a second sputtering target rather than gradually shifting from 100% use of the first sputtering target (for respective depositing the composition of the first semiconductive element 154a) to 100% use of the second sputtering target (for respective depositing the composition of the second semiconductive element 154b).

Meanwhile, the respective thickness of each of the first semiconductive element 154a and the second semiconductive element 154b may be in a range from about 5 Å to about 600 Å.

Also, the microstructure of the respective semiconductive oxide composition respectively included in the first semiconductive element 154a and the second semiconductive element 154b may be caused to be substantially amorphous, or crystalline (e.g., by post-deposit annealing), or nano-sized crystalline, or a mixture of at least two of such respective microstructures if so desired.

Returning to the structure shown in FIG. 1, it may be seen that a respective source electrode 173 and respective drain electrode 175 of the semiconductive oxides transistor (sos-TFT) are respectively connected to the second semiconductive element 154b. The source electrode 173 and the drain electrode 175 face each other and are spaced apart from one another at one major surface of the second semiconductive element 154b. In the exemplary embodiment shown in FIG. 1, the source electrode 173 and the drain electrode 175 are positioned on the second semiconductive element 154b and may directly contact the second semiconductive element 154b.

The source electrode 173 and the drain electrode 175 may be made of an aluminum-based metal of aluminum (Al) or aluminum alloys, a silver-based metal of silver (Ag) or silver alloys, a copper-based metal of copper (Cu) or copper alloys such as CuMn, a molybdenum-based metal of molybdenum (Mo) or molybdenum alloys, chromium (Cr), tantalum (Ta), titanium (Ti), etc. For example, as the molybdenum alloy, there are Mo—Nb and Mo—Ti. Alternatively or additionally, the source electrode 173 and/or the drain electrode 175 may be made of a transparent conductive material such as ITO, IZO, and AZO. The source electrode 173 and the drain electrode 175 may be respectively made of respective multilayered structures including at least two conductive layers (not shown). For example, the source electrode 173 and the drain electrode 175 may be formed of the multilayered structure such as Mo/Al/Mo, Mo/Al, Mo/Cu, CuMn/Cu, and Ti/Cu.

In one embodiment (not shown), a source-drain shorting barrier layer (not shown) is disposed on the second semiconductive element 154b and interposed between the source and drain electrodes, 173 and 175, for preventing leakage of current between them. On the other hand, according to another exemplary embodiment without the additional barrier layer (as shown in FIG. 1), a diffusion may occur of the metal components of the source electrode 173 and of the drain electrode 175 into the second semiconductive element 154b. It is desirable to prevent such contamination by the metal components. Particularly, as described above, if the content of the at least one additional element X included in the second semiconductive element 154b is equal to or more than about 1 at. % and equal to or less than about 30 at. %, the diffusion of the metal components of the source electrode 173 and the drain electrode 175 (e.g., copper (Cu)) into the second semiconductive element 154b (and/or into the first semiconductive element 154a) should be prevented. Accordingly, although the source electrode 173 and the drain electrode 175 are shown in FIG. 1 as being formed directly on the second semiconductive element 154b, in the case where the source and drain electrodes are formed with the single layer of copper (Cu) for example, the decrease of the characteristics of the thin film transistor due to copper migration and contamination should be prevented by use of one or more barrier materials.

The gate electrode 124, the source electrode 173, and the drain electrode 175 along with the first semiconductive element 154a and the second semiconductive element 154b form a semiconductive oxides TFT (sos-TFT) having a channel region thereof positioned in the first semiconductive element 154a and also positioned in the second semiconductive element 154b in the area between the source electrode 173 and the drain electrode 175.

The first semiconductive element 154a and the second semiconductive element 154b may each have an island shape, however they may alternatively have other shapes, including for example same corresponding top plan view shapes as corresponding parts of their respective source electrode 173 or drain electrode 175.

A passivation layer 180 may be formed on the source electrode 173 and the drain electrode 175 of the thin film transistor and also on the exposed second semiconductive element 154b. The passivation layer 180 may be formed of an inorganic insulator such as a silicon nitride or a silicon oxide, an organic insulator, and/or a low dielectric constant other insulating material.

The structure of an exemplary thin film transistor according to the present disclosure has been described, however the structures of the thin film transistors in accordance with the present disclosure are not limited thereto. The first semiconductive element 154a and the second semiconductive element 154b having the compositional attributes and characteristics described herein may be applied to other semiconductive devices of various other structures and of corresponding manufacturing methods such that the charge-carrier mobility and threshold deviation characteristics of the same may be improved in accordance with the present teachings.

Next, various structures for semiconductive oxides TFT's (sos-TFT's) according to further exemplary embodiments of the present disclosure will be described with reference to FIG. 4, FIG. 5, and FIG. 6. The same constituent elements as in the previous exemplary embodiment are indicated by the same reference numerals, and the corresponding descriptions are therefore omitted.

Figure 4:
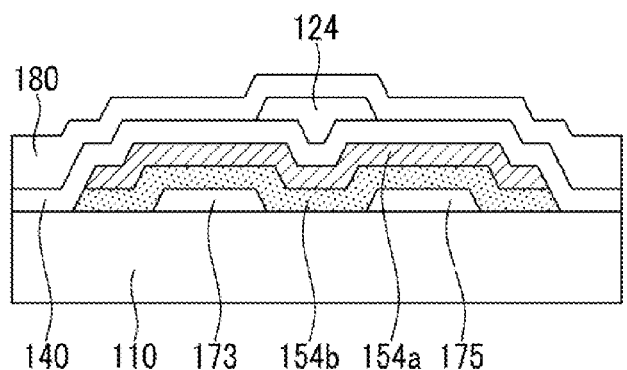
FIG. 4 is a cross-sectional view of a second thin film transistor according to an exemplary embodiment of the present disclosure.

FIG. 4 is a cross-sectional view of a thin film transistor according to an exemplary second embodiment where the gate electrode is disposed on top. FIG. 5 is a cross-sectional view of a thin film transistor according to another exemplary embodiment. FIG. 6 is a cross-sectional view of a thin film transistor having a barrier between the source and drain according to another exemplary embodiment.

Firstly, referring to FIG. 4, the thin film transistor shown there is substantially the same in functionality as the first exemplary embodiment shown in FIG. 1. However the gate electrode 124 is positioned on top, the first semiconductive element 154a is disposed next below that, the second semiconductive element 154b is disposed further below that and the source electrode 173 and the drain electrode 175 are positioned under the second semiconductive element 154b.

In terms of more detail with respect to FIG. 4, the source electrode 173 and the drain electrode 175 are formed and patterned directly on the substrate 110. Next the material layers of the second semiconductive element 154b and of the first semiconductive element 154a are sequentially deposited in the recited order and thereafter simultaneously patterned. Next, the gate insulating layer 140 is positioned on the layer of the first semiconductive element 154a. Next, the material of the gate electrode 124 is positioned thereon at least in an area corresponding to a separation space between the source electrode 173 and the drain electrode 175. The passivation layer 180 is positioned over the gate electrode 124. Contact holes (not shown) are formed and a data line (not shown) is connected to the source electrode 173 while a pixel electrode (not shown) is connected to the drain electrode 175.

In addition, in the exemplary embodiment shown in FIG. 4, the materials, the compositions, and the content of each constituent element, particularly the characteristics of the first and second semiconductive elements, 154a and 154b, may be made the same as those of the exemplary embodiment shown in FIG. 1.

Figure 5:
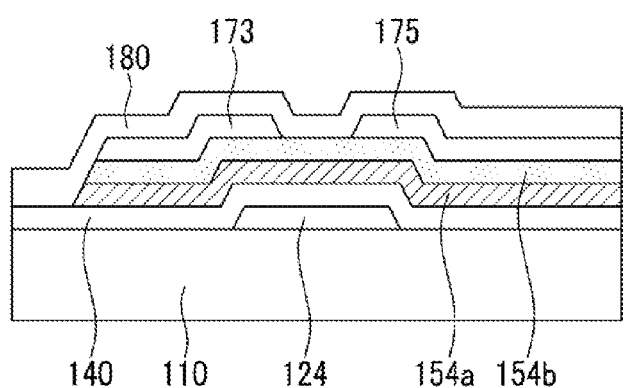
FIG. 5 is a cross-sectional view of another semiconductive oxides TFT (sos-TFT) according to an exemplary embodiment of the present disclosure.

Next, referring to FIG. 5, the thin film transistor according to that exemplary embodiment is substantially the same as the exemplary embodiment shown in FIG. 1, and the first and second semiconductive elements, 154a and 154b, except for the relative size of the channel portion may have substantially the same plan view shapes as the source electrode 173 and the drain electrode 175. This thin film transistor may be formed by simultaneously patterning the first and second semiconductive elements, 154a and 154b, and the source electrode 173 and the drain electrode 175, by using a common etch mask for all where the common etch mask includes a so-called, slitted or translucent region. (See also FIG. 9 as described later below.)

In addition, for the exemplary embodiment shown in FIG. 5, the materials, the compositions, and the content of each constituent elements, particularly the characteristics of the first and second semiconductive elements, 154a and 154b, may be made substantially the same as those of the exemplary embodiment shown in FIG. 1.

Figure 6:
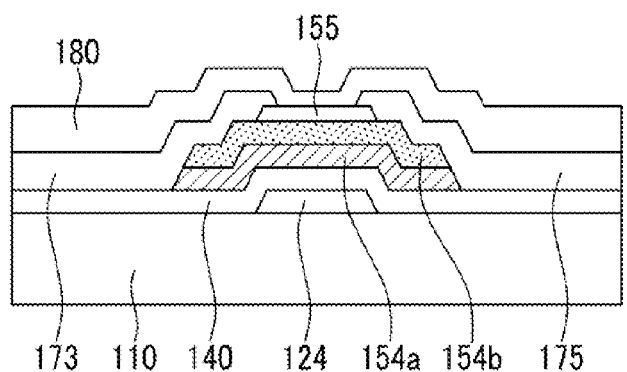
FIG. 6 is a cross-sectional view of yet another thin film transistor according to an exemplary embodiment of the present disclosure.

Next, referring to FIG. 6, the thin film transistor according to the illustrated embodiment thereof is substantially the same as most of the exemplary embodiment shown in FIG. 1, except that an etch stopper (referred to herein also as an etching preventing layer) 155 is further positioned on the second semiconductive element 154b. The etch stopper 155 protectively covers the channel areas of the first and second semiconductive elements, 154a and 154b, such that damage to the channel region of the thin film transistor by the etchant may be prevented in following patterning processes. Also, the etch stopper 155 prevents impurities such as hydrogen from being diffused into the first and second semiconductors 154a and 154b for example from an insulating material of the passivation layer 180, thereby preventing a change of the characteristics of the first and second semiconductors 154a and 154b.

The thickness of the etch stopper 155 may be equal to or less than about 3000 Å, and the etch stopper 155 may be formed of an inorganic material layer including at least one material of SiOx, SiNx, SiOCx, and SiONx, or the organic layer including the organic material or a polymer organic material.

The passivation layer 180 is positioned on top of the etch stopper 155 as well as over the source electrode 173, and the drain electrode 175.

In addition, for the exemplary embodiment shown in FIG. 6, the materials, the compositions, and the contents of each constituent elements, particularly the characteristics of the first and second semiconductive elements, 154a and 154b, may be made substantially the same as those of the exemplary embodiment shown in FIG. 1.

Next, a manufacturing method of the thin film transistor according to the exemplary embodiment shown in FIG. 5 will be described with reference to FIG. 7, FIG. 8, FIG. 9, FIG. 10, FIG. 11, FIG. 12, and FIG. 13.

Figure 10:
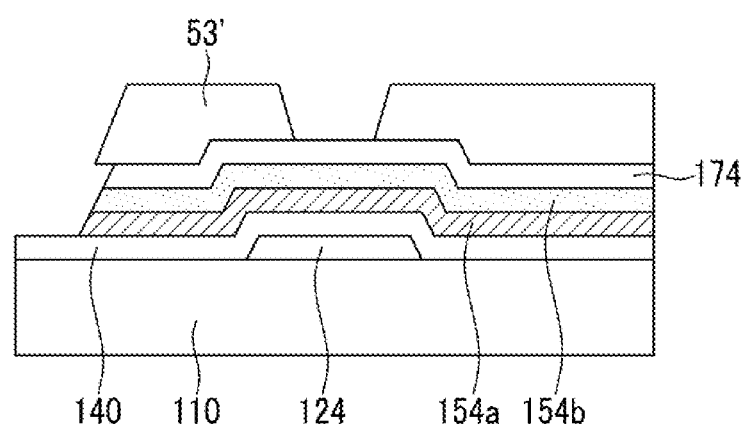
Figure 11:
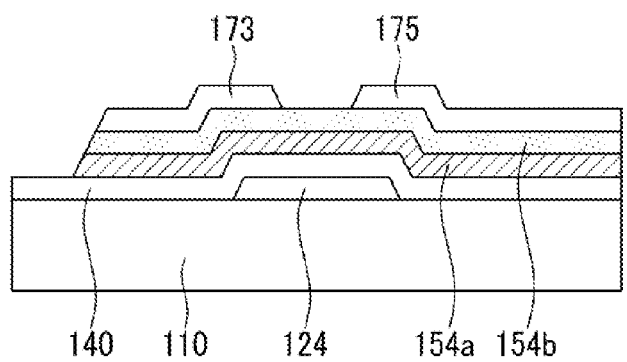
Figure 12:
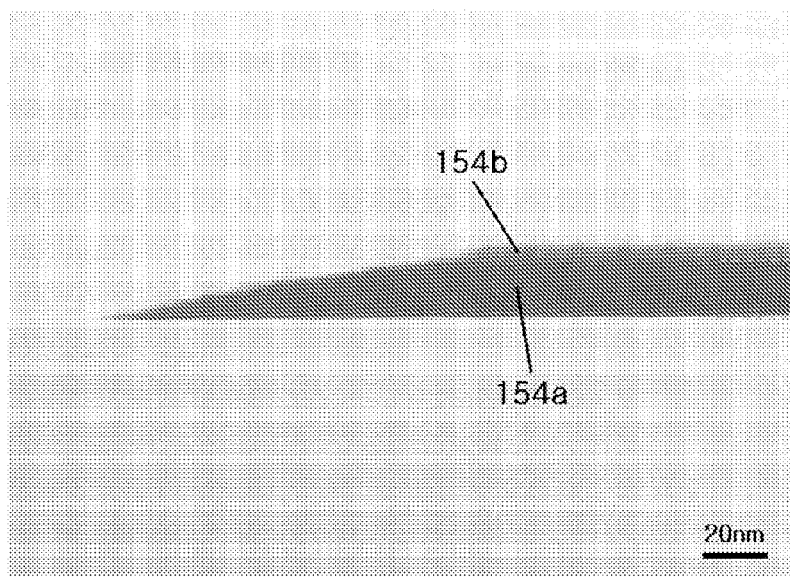
FIG. 12 is a photo showing a cross-section of an semiconductive oxide layer of a thin film transistor according to an exemplary embodiment of the present disclosure.
Figure 13:
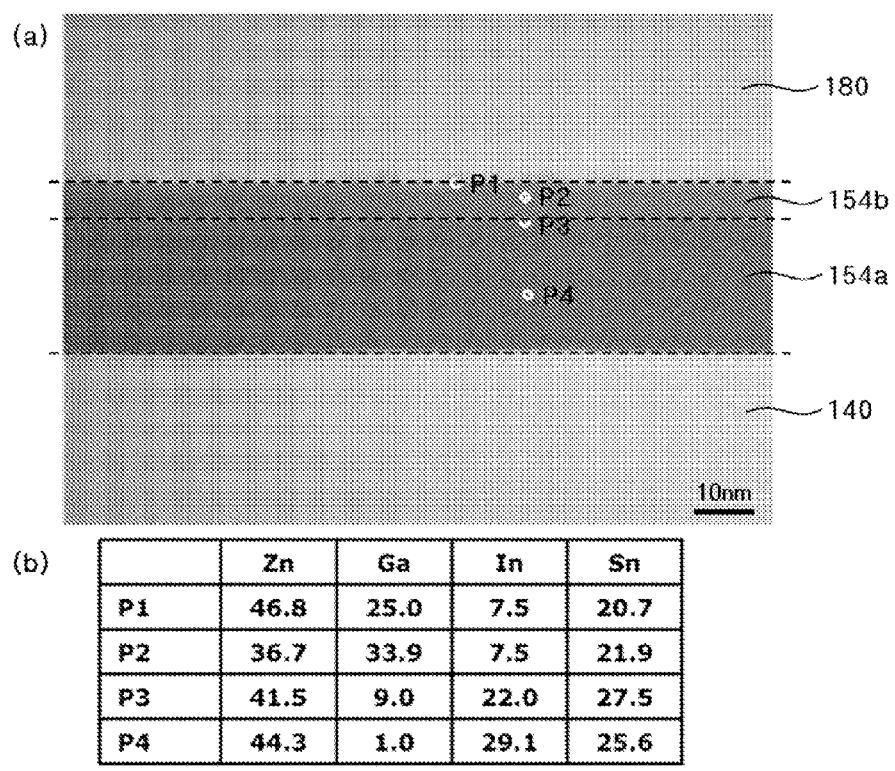
FIG. 13 is a photo (a) showing a cross-sectional of an semiconductive oxide layer of a thin film transistor according to an exemplary embodiment of the present disclosure and a table (b) showing components according to a position of an semiconductive oxide layer.

FIG. 7 to FIG. 11 are cross-sectional views sequentially showing a manufacturing method of the thin film transistor shown in FIG. 5, FIG. 12 is a micrograph photo showing a cross-section of a semiconductive oxide layer of a thin film transistor according to an exemplary embodiment of the present disclosure, and FIG. 13 is a photo (a) showing a cross-section of a semiconductive oxide layer of a thin film transistor according to an exemplary embodiment of the present disclosure and a table (b) showing components according to a positions within an semiconductive oxide layer.

Figure 7:
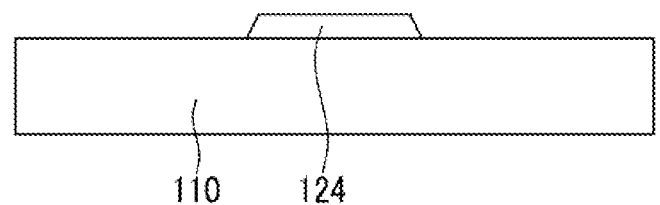
FIG. 7 to FIG. 11 are cross-sectional views sequentially showing a manufacturing method of the thin film transistor shown in FIG. 5.

Firstly, referring to FIG. 7, the material layer of the gate electrode 124 is deposited and patterned so as to position the gate electrode at a predetermined location on the substrate 110, where the latter includes an insulating material such as plastic or glass.

Figure 8:
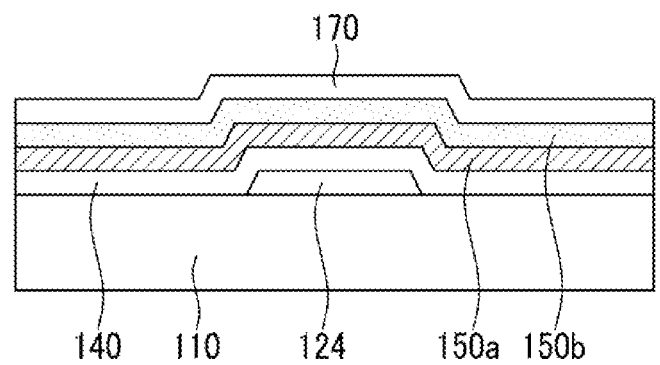

Next, referring to FIG. 8, a gate insulating layer 140 is provided as made of an insulating material such as a silicon oxide (SiOx), a silicon nitride (SiNx), or a silicon oxynitride (SiOxNy) where the insulating layer 140 is formed on the patterned gate electrode 124. Next, a first semiconductive oxide layer 150a, a second semiconductive oxide layer 150b, and a source and drain forming conductive layer 170 are sequentially deposited thereon in the illustrated order.

The first semiconductive oxide layer 150a may be formed by a sputtering method using a corresponding, first semiconductive oxide target whose composition includes the desired oxides including for example indium (In), tin (Sn), and zinc (Zn).

The second semiconductive oxide layer 150b may be similarly formed by the sputtering method using a corresponding second semiconductive oxide target whose composition includes the additional element X where the latter includes at least one of gallium (Ga), silicon (Si), niobium (Nb), hafnium (Hf), and germanium (Ge), and optionally further including indium (In) or not. The content of the at least one additional element X included in the second semiconductive oxide layer 150b may be in the range from about 1 at. % to about 30 at. %.

The conductive layer 170 may be formed by a corresponding sputtering method using a third target made of the desired metals, such as for example, copper (Cu).

Figure 9:
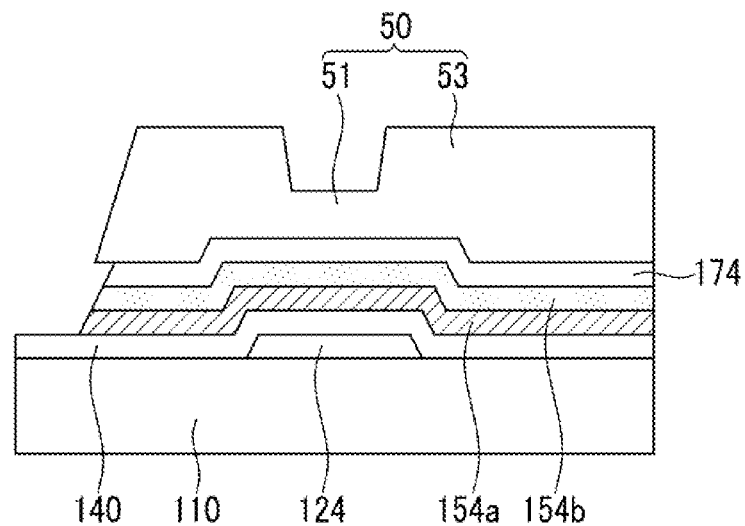

Next, referring to FIG. 9, a photosensitive film 50 is formed on the conductive layer 170 and patterned to thereby define a patterned etch stop. More specifically, the patterned photosensitive film 50 (a.k.a. photoresist or PR) includes a first portion 51 having a relatively thin thickness and a second portion 53 having a relatively thicker thickness. The first portion 51 aligns with the location of the gate electrode 124.

The first semiconductive oxide layer 150a, the second semiconductive oxide layer 150b, and the conductive layer 170 are simultaneously etched according to a predetermined pattern by using the photosensitive film 50 as an etching mask to thereby form the first semiconductive element 154a, the second semiconductive element 154b, and a partially patterned conductor layer 174 as shown in FIG. 10. At this time, a wet-etching process may be used, and the etchant used may be an etchant that is capable of selectively etching the conductive layer 170, the first semiconductive oxide layer 150a, and the second semiconductive oxide layer 150b together. The difference between the etch rates of the first semiconductive element 154a and the second semiconductive element 154b for the etchant should be equal to or less than about 100 Å/s such that an undercut or misalignment generated between edges of the first semiconductive element 154a and those of the second semiconductive element 154b may be prevented. In FIGS. 10-11, the spacing between the source and drain electrodes is formed in a position overlying the gate electrode 124.

Referring to FIG. 12, it may be confirmed by way of a micrograph that too much of an undercut or misalignment (e.g., more than about 100 nm) is not generated between the edges of the first semiconductive oxide layer 150a and the second semiconductive oxide layer 150b formed according to an exemplary embodiment of the present disclosure.

Next, referring in more detail to FIG. 10, the photosensitive film 50 is partially ashed or partially dry-etched to remove an upper thickness part including the first portion 51 having the thin thickness. At this time, the thickness of the second portion 53 is decreased by a thickness of the removed first portion 51 thereby forming a modified photosensitive film 53' as shown.

Next, referring in more detail to FIG. 11, by using the modified photosensitive film 53' as the etching mask, the conductor layer 174 is patterned to form the source electrode 173 and the spaced apart drain electrode 175. At this time, in order to not etch the first and second semiconductive oxide layers 154a and 154b, the etch rate of the etchant for the conductor layer 174 is selected so as to be selective against etching the first and second semiconductive oxide layers 154a and 154b.

Next, the photosensitive film 53' is removed, and as shown in FIG. 5, the passivation layer 180 of the insulating material is formed. After coating the insulating material for the passivation layer 180, to improve the characteristics of the thin film transistor, a heat treatment may be performed at a high temperature or annealing may be performed. The heat treatment may be applied with various methods such as a dry type, a wet type, a furnace type, and rapid thermal annealing (RTA). The applied heat or annealing treatment may cause crystallization within one or both of the first and second semiconductive elements, 154a and 154b.

Referring to the cross-sectional micrograph of FIG. 13 as shown in portion (a) of FIG. 13, although the heat treatment is performed after forming the passivation layer 180, the components of the first semiconductive element 154a and the second semiconductive element 154b formed by the manufacturing method are essentially not mixed with each other and the first semiconductive element 154a and the second semiconductive element 154b remain substantially divided from each other.

The compositional analysis shown in portion (b) of FIG. 13 is for an example including gallium (Ga) as the additional element X of the second semiconductive element 154b, and it also includes a small amount of indium (In). The components of the first position P1 and the second position P2 corresponding to the second semiconductive element 154b are almost equally maintained, and the components of the third position P3 and the fourth position P4, where the latter are disposed within a depth corresponding to the first semiconductive element 154a are also equally maintained such that it may be confirmed that little movement (change) of the compositional elements has occurred respectively as between the components of the first semiconductive element 154a and those of the second semiconductive element 154b. More specifically, despite an annealing step, there is no discernible mixing of the components of the first semiconductive element 154a with those of the second semiconductive element 154b or the formation of an interposed third layer at the boundary (dashed line above P3) between the first semiconductive element 154a and the second semiconductive element 154b even though the heat treatment was applied in the manufacturing process of the corresponding thin film transistor.

Next, the method of manufacturing the thin film transistor according to the exemplary embodiment of FIG. 6 will be described with reference to FIG. 14, FIG. 15, FIG. 16, FIG. 17, and FIG. 18. The same constituent elements as in the previous exemplary embodiment are indicated by the same reference numerals, and the same description will therefore be omitted.

FIG. 14 to FIG. 18 are cross-sectional views sequentially showing a manufacturing method for the thin film transistor shown in FIG. 6.

Figure 14:
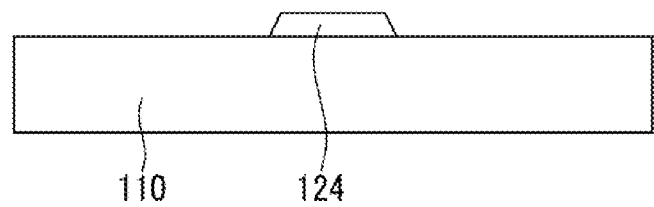
FIG. 14 to FIG. 18 are cross-sectional views sequentially showing a manufacturing method of the thin film transistor shown in FIG. 6.

Firstly, referring to FIG. 14, the gate electrode 124 is formed so as to be positioned on a substrate 110 including a light-passing insulating material such as plastic or glass.

Figure 15:
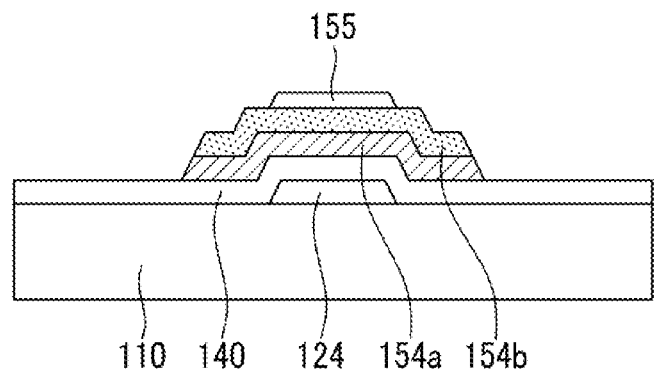

Next, referring to FIG. 15, the gate insulating layer 140 made of the insulating material such as a silicon oxide (SiOx), a silicon nitride (SiNx), or a silicon oxynitride (SiOxNy) is formed on the gate electrode 124. Thereafter, the respective layers of the first semiconductive element 154a and of the second semiconductive element 154b are sequentially formed on top of the gate insulating layer 140.

The pre-patterning first semiconductive oxide layer (not shown) and the pre-patterning second semiconductive oxide layer (not shown) may be sequentially deposited by sputtering and using a corresponding set of semiconductive oxide targets including one composed of the semiconductive oxide including indium (In), tin (Sn), and zinc (Zn) and the other target being composed of its respective semiconductive oxide including the additional element X including at least one of tin-zinc oxide and gallium, silicon, niobium, hafnium, and germanium and optionally including indium or not to thereby respectively form the first semiconductive element 154a and the second semiconductive element 154b. At this time, a wet-etching using an etchant may be used, and the difference between the etch rates of the etchant for the first semiconductive element 154a and the second semiconductive element 154b may be equal to or less than about 100 Å/s, and more in detail, it may be equal to or less than about 10 Å/s. The content of at least one additional element X included in the second semiconductive element 154b may be in the range from about 1 at. % to about 30 at. %.

After patterning the first semiconductive element 154a and the second semiconductive element 154b, a heat treatment (a crystallizing anneal) is performed for the entire substrate 110 thereby improving the characteristics of the being-formed thin film transistor. The heat treatment method may be various methods such as the dry type, the wet type, the furnace type, and the rapid thermal annealing (RTA). As described, the composition components of the first semiconductive element 154a and the second semiconductive element 154b according to the composition attributes of the present disclosure are not mixed with each other after the heat treatment and an interposed new third layer is not formed in the boundary between the first semiconductive element 154a and the second semiconductive element 154b such that the characteristics of the thin film transistor are not negatively affected by the crystallizing anneal step and the charge-carrier mobility characteristics of the semiconductive oxides TFT (sos-TFT) may be improved by the crystallizing anneal step.

Next, the etch stopper 155 may be additionally formed on the second semiconductive element 154b. The etch stopper 155 may be formed by depositing and thereafter etching an insulating layer on the second semiconductive element 154b for example by chemical vapor deposition (CVD) or sputtering. At this time, a dry-etch method may be used, and an etching gas having a selective etch rate so as not to etch the first semiconductive element 154a and the second semiconductive element 154b may be used.

After patterning the etch stopper 155, a second heat treatment is performed for the entire substrate 110 to further improve the characteristics of the thin film transistor. The heat treatment method may be various methods such as the dry type, the wet type, the furnace type, and the rapid thermal annealing (RTA). In this case, the composition components of the first semiconductive element 154a and the second semiconductive element 154b are not mixed with each other and a new third layer is not formed in the boundary between the first semiconductive element 154a and the second semiconductive element 154b such that the characteristics of the thin film transistor are not negatively affected by the second crystallizing anneal step and the charge-carrier mobility characteristics of the semiconductive oxides TFT (sos-TFT) may be improved by the second crystallizing anneal step.

Figure 16:
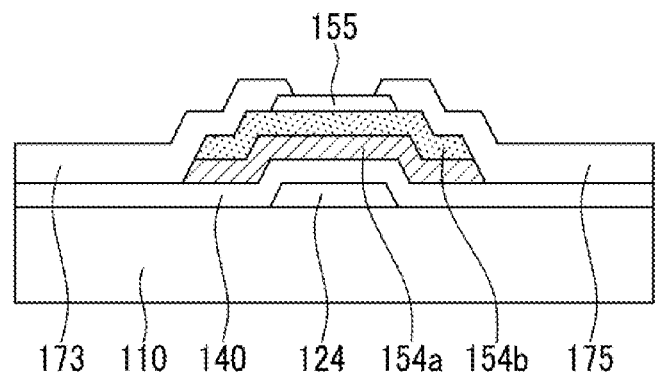

Next, referring to FIG. 16, the source and drain metal such as for example one including copper (Cu) is deposited and patterned on the gate insulating layer 140, the second semiconductive element 154b, and the etch stopper 155 to thereby form the source electrode 173 and the drain electrode 175. At this time, a wet-etching may be used, and an etchant having a selective etch rate so as not to etch the first semiconductive element 154a and the second semiconductive element 154b may be used.

Figure 17:
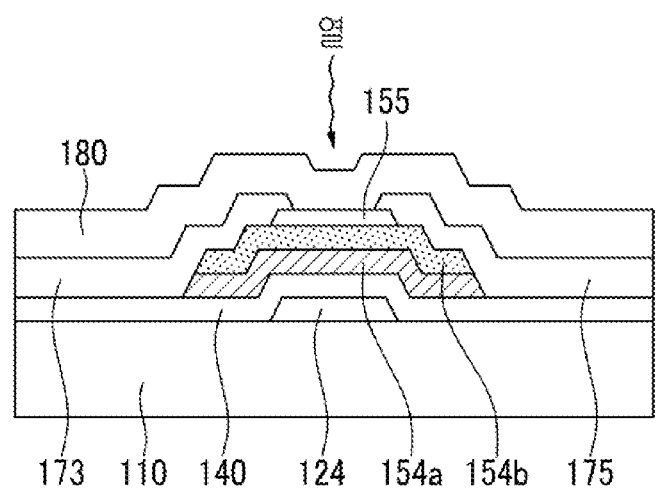
Figure 18:
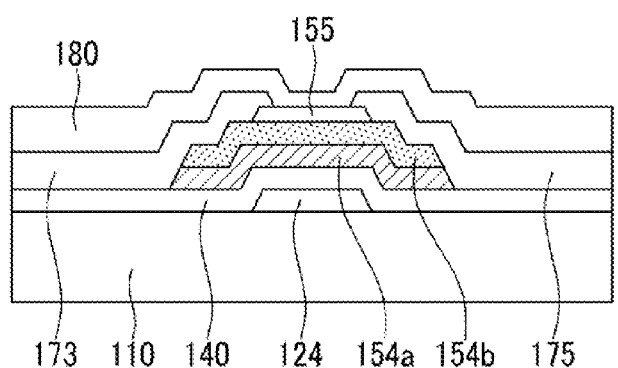

Next, referring to FIG. 17 and FIG. 18, an inorganic insulator such as a silicon nitride or a silicon oxide, or an organic insulator, or a low dielectric constant insulating insulator is deposited on the source electrode 173 and the drain electrode 175 to form the passivation layer 180. As described above, after coating the insulating material for the passivation layer 180, a further heat treatment or annealing step may be performed at a high temperature to further improve the characteristics of the thin film transistor. The heat treatment method may be various methods such as the dry type, the wet type, the furnace type, and the rapid thermal annealing (RTA).

Next, a structure of a thin film transistor array panel that includes plural ones of the semiconductive oxides TFT's (sos-TFT's) according to the present disclosure will be described with reference to FIG. 19 and FIG. 20. The same constituent elements as in the previous exemplary embodiment are indicated by the same reference numerals, and a repeated description is therefore omitted.

Figure 19:
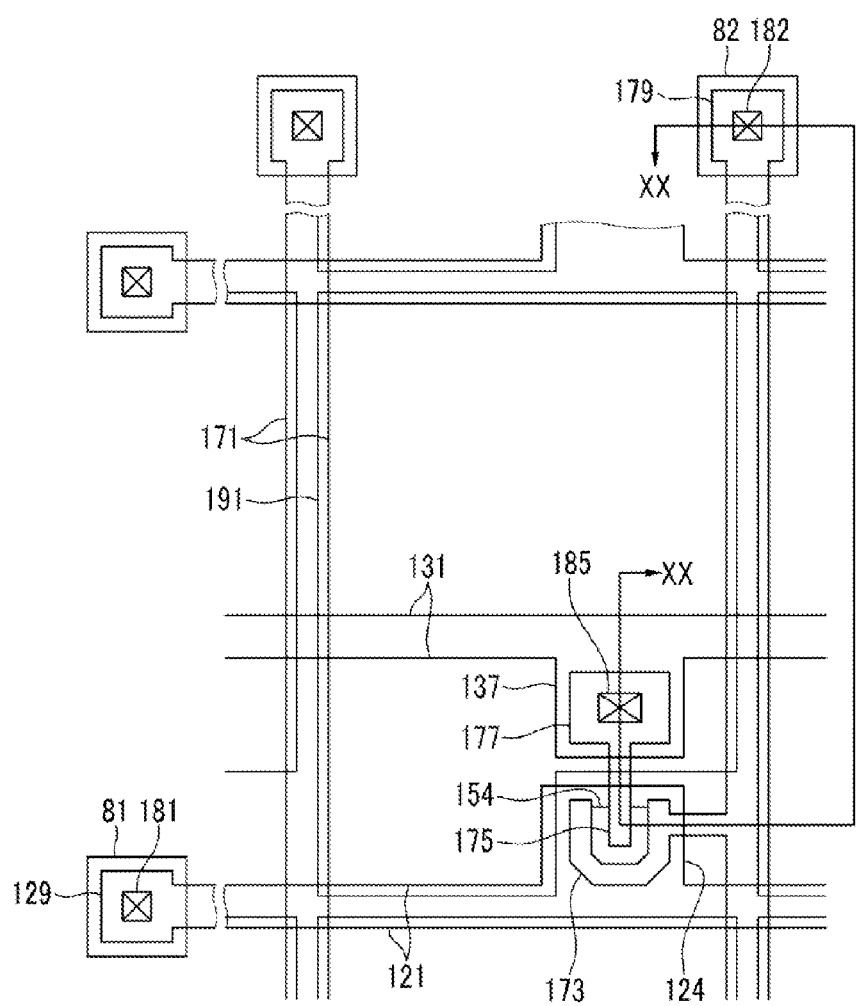
FIG. 19 is a layout view of a thin film transistor array panel of a display device including the same according to an exemplary embodiment of the present disclosure.

FIG. 19 is a top plan layout view of a thin film transistor array panel and a display device including the same according to an exemplary embodiment of the present disclosure. FIG. 20 is one cross sectional example of the thin film transistor array panel of FIG. 19 taken along the line XX-XX.

In the present exemplary embodiment, the thin film transistor array panel is of the liquid crystal display (LCD) type. However the thin film transistor array panel according to other exemplary embodiments may be applied to several other kinds of flat panel displays such as organic light emitting devices (OLED displays), electrophoretic displays, etc.

In FIG. 19, a gate line 121 and a storage electrode line 131 are positioned on the insulating substrate 110 made of glass or plastic.

The gate line 121 may transmit gate signals and may extend in an approximate row direction, and may include a plurality of gate electrodes 124 integrally branching out therefrom. Also, the gate line 121 includes a terminal end 129. However, the end 129 of the gate line may be omitted.

A storage electrode line 131 configured for receiving a predetermined voltage extends substantially parallel to the gate line 121 and includes a storage electrode 137 integrally branching out therefrom. The shape and arrangement of the storage electrode line 131 and the storage electrode 137 may be various. The storage electrode line 131 may be omitted.

The gate line 121 and the storage electrode line 131 may be made of appropriate conductive materials such as an aluminum-based metal of aluminum (Al) or aluminum alloys, a silver-based metal of silver (Ag) or silver alloys, a copper-based metal of copper (Cu) or copper alloys, a molybdenum-based metal of molybdenum (Mo) or molybdenum alloys, chromium (Cr), tantalum (Ta), and titanium (Ti). Also, the gate line 121 and the storage electrode line 131 may be made of or include a transparent conductive material such as ITO, IZO, and AZO. The gate line 121 and the storage electrode line 131 may be made of a multilayered structure including at least two conductive layers (not shown).

A gate insulating layer 140 is positioned on the gate line 121 and on the storage electrode line 131. The gate insulating layer 140 may include a silicon nitride, a silicon oxide, a SiON composition, or an organic insulating material. The gate insulating layer 140 may have a multilayered structure including at least two insulating layers (not shown). For example, an upper layer of the gate insulating layer 140 may include SiOx and a lower layer may include SiNx, or the upper layer may include SiOx and the lower layer may include SiOxNy.

The first semiconductive element 154a and the second semiconductive element 154b including the respective semiconductive oxides are formed on the gate insulating layer 140. The constitutions and the characteristics of the first semiconductive element 154a and the second semiconductive element 154b may be the same as those of the several exemplary embodiments described above and as such the detailed description is omitted.

A data line 171 and a drain electrode 175 are formed on the second semiconductive element 154b.

The data line 171 is configured for transmitting the data voltages of the display and it extends in the approximate column direction and intersects the gate line 121. The data line 171 includes a terminal end 179, and may include a source electrode 173 curved with a "U" shape on the gate electrode 124. In addition, the shape of the source electrode 173 may be changed.

The drain electrode 175 is separated from the data line 171 and may include an end of a bar type enclosed by the source electrode 173 and an expansion portion 177 as the other end. The expansion portion 177 may overlap the storage electrode 137. As seen in FIG. 20, the expansion portion 177 may be used as a contact area for electrical connection to the pixel-electrode 191.

The data line 171 and the drain electrode (175 and 177) may be made of an aluminum-based metal of aluminum (Al) or aluminum alloys, a silver-based metal of silver (Ag) or silver alloys, a copper-based metal of copper (Cu) or copper alloys such as CuMn, a molybdenum-based metal of molybdenum (Mo) or molybdenum alloys, chromium (Cr), tantalum (Ta), titanium (Ti), etc. For example, as the molybdenum alloy, there are Mo—Nb and Mo—Ti. Also, the source electrode 173 and the drain electrode 175 may include a transparent conductive material such as ITO, IZO, and AZO. The source electrode 173 and the drain electrode 175 may be made of a multilayered structure including at least two conductive layers (not shown).

The gate electrode 124, the source electrode 173, and the drain electrode 175 form the thin film transistor along with the first semiconductive element 154a and the second semiconductive element 154b, and the channel of the thin film transistor is positioned in the first semiconductive element 154a and the second semiconductive element 154b between the source electrode 173 and the drain electrode 175.

The first semiconductive element 154a and the second semiconductive element 154b except for the channel may have substantially the same plan view shape as the portions of the data line 171 and the drain electrode 175 overlapping them. The forming method of the first semiconductive element 154a and the second semiconductive element 154b, and the data line 171 and the drain electrode 175, may depend on the manufacturing method shown in FIG. 7 to FIG. 13.

A passivation layer 180 made of an inorganic and/or organic insulating material is formed on the data line 171 and the drain electrode 175. The passivation layer 180 may be formed with multiple layers. For example, a lower layer of the passivation layer 180 may include a SiOx composition and an upper layer may include a SiNx composition, or the lower layer may include SiOx and the upper layer may include SiOxNy.

The passivation layer 180 has a contact hole 185 exposing the expansion part (over 177) of the drain electrode 175 and a contact hole 182 exposing the end 179 of the data line. Also, the passivation layer 180 and the gate insulating layer 140 have a contact hole 181 exposing the end 129 of the gate line 121.

A pixel electrode 191 and contact assistants 81 and 82 are formed so as to be positioned on the passivation layer 180. The pixel electrode 191 and the contact assistants 81 and 82 may be made of a transparent conductive material such as ITO or IZO. The pixel electrode 191 is electrically connected to the drain electrode 175 through the contact hole 185 thereby receiving the data voltage. The contact assistant 81 is positioned on the end 129 of the gate line and is connected to the end 129 of the gate line through the contact hole 181. The contact assistant 82 is positioned on the end 179 of the data line and is connected to the end 179 of the data line through the contact hole 182.

Next, a display device including semiconductive oxides TFT's (sos-TFT's) according to an exemplary embodiment of the present disclosure will be described with reference to FIG. 19 and FIG. 21. The same constituent elements as in the previous exemplary embodiment are indicated by the same reference numerals, and the same description is therefore omitted.

Figure 21:
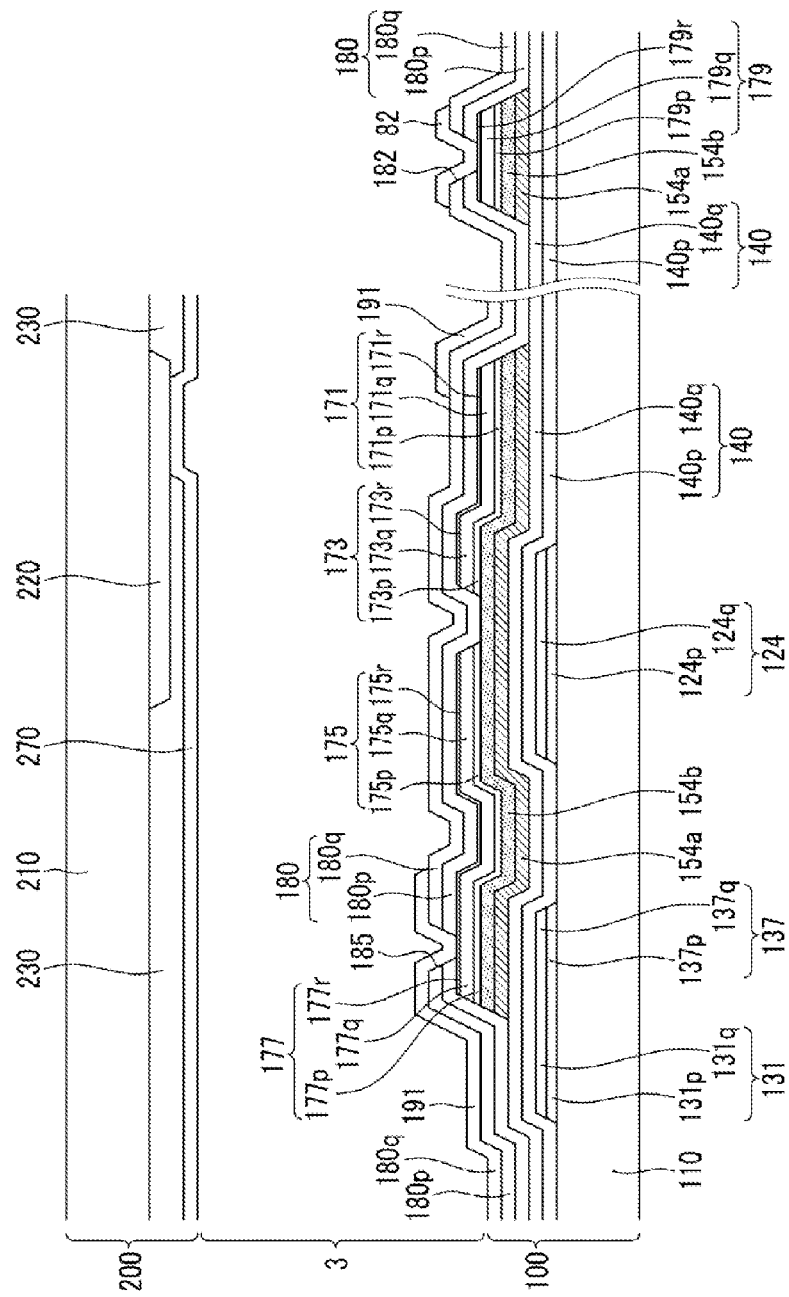
FIG. 21 is one example of a cross-sectional view of a display device including the thin film transistor array panel of FIG. 19 taken along the line XX-XX.

FIG. 21 is one example of other possible cross-sectional view of a display device including the thin film transistor array panel of FIG. 19 taken along the line XX-XX.

The display device according to the present exemplary embodiment of FIG. 21 includes a lower panel 100 and an upper panel 200 facing each other, and a liquid crystal layer 3 interposed therebetween.

Figure 20:
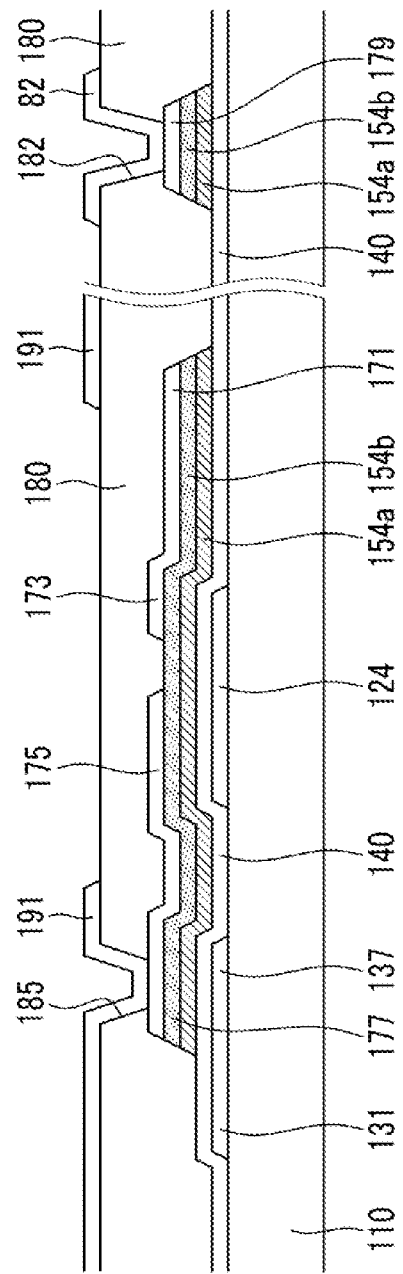
FIG. 20 is one example of a cross-sectional view of the thin film transistor array panel of FIG. 19 taken along the line XX-XX.

The lower panel 100 includes the thin film transistor array which is substantially the same as most of the exemplary embodiment shown in FIG. 20. However in the present exemplary embodiment, at least one of the gate line 121, the storage electrode line 131, the gate insulating layer 140, the passivation layer 180, the data line 171, and the drain electrode 175 may include multiple conductive material layers.

In detail, the gate electrode 124 may include a lower gate electrode 124p and an upper gate electrode 124q, and the storage electrode line 131 may include a lower storage electrode line 131p and an upper storage electrode line 131q. For example, the lower gate electrode 124p and the lower storage electrode line 131p may include titanium (Ti), and the upper gate electrode 124q and the upper storage electrode line 131q may include copper (Cu).

The gate insulating layer 140 may include a lower gate insulating layer 140p and an upper gate insulating layer 140q. For example, the lower gate insulating layer 140p may include a silicon nitride (SiNx), the upper gate insulating layer 140q may include a silicon oxide (SiOx), and they may be exchanged.

The first semiconductive element 154a and the second semiconductive element 154b positioned on the gate insulating layer 140 are the same as the first semiconductive element 154a and the second semiconductive element 154b included in the thin film transistor according to the above several exemplary embodiments such that the detailed description thereof is omitted.

The data line 171 and the drain electrode 175 may include triple layers. The data line 171 may include lower data lines 171p, 173p, and 179p, middle data lines 171q, 173q, and 179q, and upper data lines 171r, 173r, and 179r, and the drain electrode 175 may include lower drain electrodes 175p and 177p, middle drain electrodes 175q and 177q, and upper drain electrodes 175r and 177r. For example, the triple layers may include molybdenum (Mo), aluminum (Al), and molybdenum (Mo) that are sequentially positioned, for example in the recited order. Differently, the data line 171 and the drain electrode 175 may be formed with a dual layer of Ti/Cu or CuMn/Cu.

The passivation layer 180 may also be formed of a dual layer of a lower passivation layer 180p and an upper passivation layer 180q.

Referring to the upper panel 200, a light blocking member 220 and a color filter 230 are formed on an insulation substrate 210. The light blocking member 220 is referred to as a black matrix, and may be used to prevent light leakage between pixels. The color filter 230 may have a belt shape between adjacent data lines 171. The color filter 230 may include pigments for producing corresponding red, green, or blue emitted lights, and a photosensitive organic material.

An opposing electrode 270 is formed on the light blocking member 220 and the color filter 230. The opposing electrode 270 may include a transparent conductive oxide such as ITO and IZO.

The liquid crystal layer 3 may have positive or negative dielectric anisotropy, and liquid crystal molecules of the liquid crystal layer 3 are aligned such that the long axes thereof may be arranged parallel or perpendicular to the surface of the lower and upper display panels 100 and 200 when an electric field is not applied.

When the pixel electrode 191 is supplied with an appropriate data voltage from the drain electrode 175, it generates an electric field through the liquid crystal layer 3 and to the opposing electrode 270 of the upper panel 200, thereby determining the orientation direction of the liquid crystal molecules of the liquid crystal layer 3 between the pixel electrode 191 and the opposing electrode 270. Accordingly, with the aid of polarizing layers, the luminance of the light transmitted through the liquid crystal layer 3 may be caused to differ depending on the thusly determined orientation of the liquid crystal molecules.

The pixel electrode 191 and the opposing electrode 270 form a liquid crystal capacitor such that the applied voltage is maintained (e.g., over a frame period) even after the thin film transistor is turned off.

The pixel electrode 191 and the drain electrode 175 connected thereto overlap the storage electrode 137 and the storage electrode line 131, thereby forming the storage capacitor.

Next, another display device including the thin film transistor according to an exemplary embodiment of the present disclosure will described with reference to FIG. 19 and FIG. 22. The same constituent elements as in the previous exemplary embodiment are indicated by the same reference numerals, and the same description is omitted.

Figure 22:
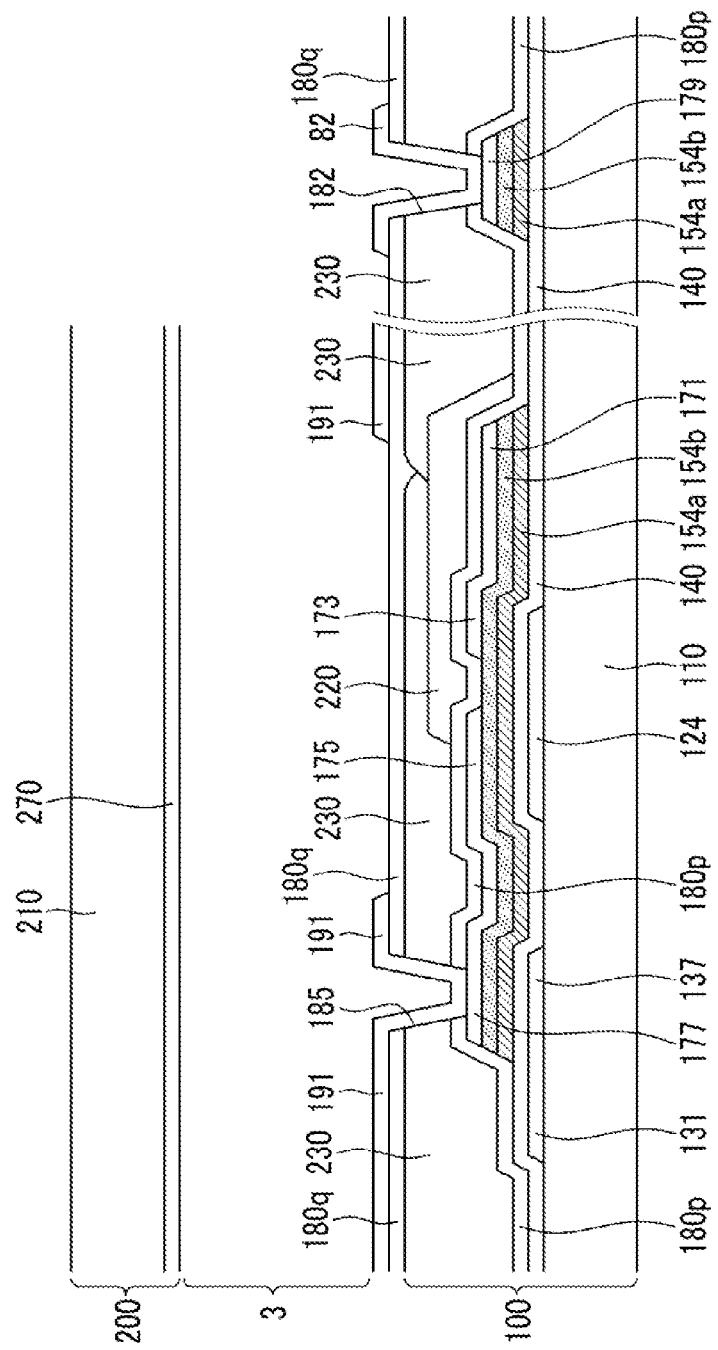
FIG. 22 is one example of a cross-sectional view of a display device including the thin film transistor array panel of FIG. 19 taken along the line XX-XX.

FIG. 22 is one example of a cross-sectional view of a display device including the thin film transistor array panel of FIG. 19 taken along the line XX-XX, The display device according to the present exemplary embodiment includes the lower panel 100 and the upper panel 200, and the liquid crystal layer 3 interposed therebetween.

The lower panel 100 according to the present exemplary embodiment as the thin film transistor panel is the same as most of the exemplary embodiment shown in FIG. 20, however the light blocking member 220 and the color filter 230 are further included. Also, the passivation layer 180 includes the lower passivation layer 180p and the upper passivation layer 180q. The light blocking member 220 and the color filter 230 may be positioned between the lower passivation layer 180p and the upper passivation layer 180q.

Referring to the upper panel 200, the opposing electrode 270 is positioned on the substrate 210.

Differently from FIG. 22, in an alternate embodiment, one of the light blocking member 220 and the color filter 230 may be positioned in the upper panel 200, and the other may be positioned in the lower panel 100.

Next, yet another display device including the semiconductive oxides TFT's (sos-TFT's) according to the present disclosure will be described with reference to FIG. 23, FIG. 24, FIG. 25, and FIG. 26. The same constituent elements as in the previous exemplary embodiment are indicated by the same reference numerals, and the same description is omitted.

Figure 23:
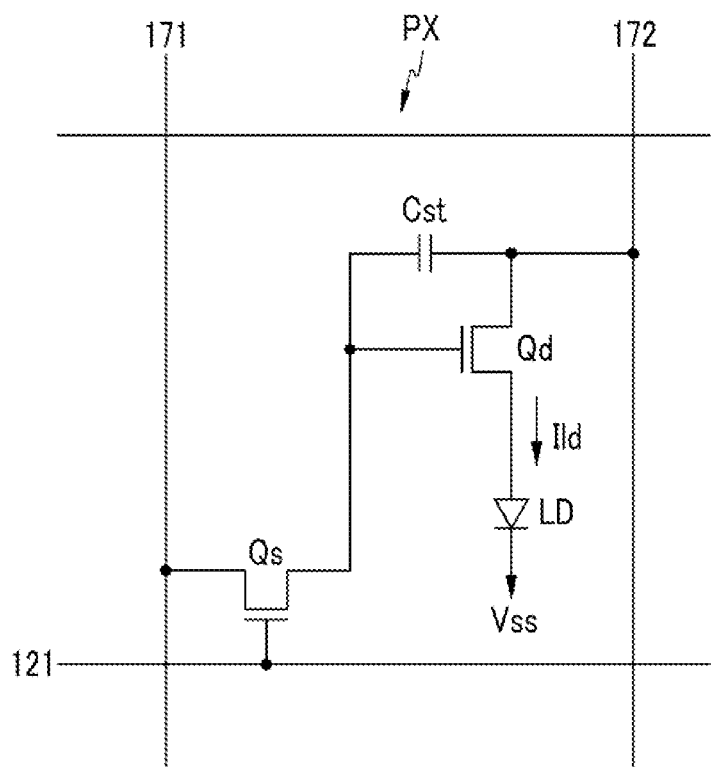
FIG. 23 is an equivalent circuit diagram of a display device according to an exemplary embodiment of the present disclosure.
Figure 24:
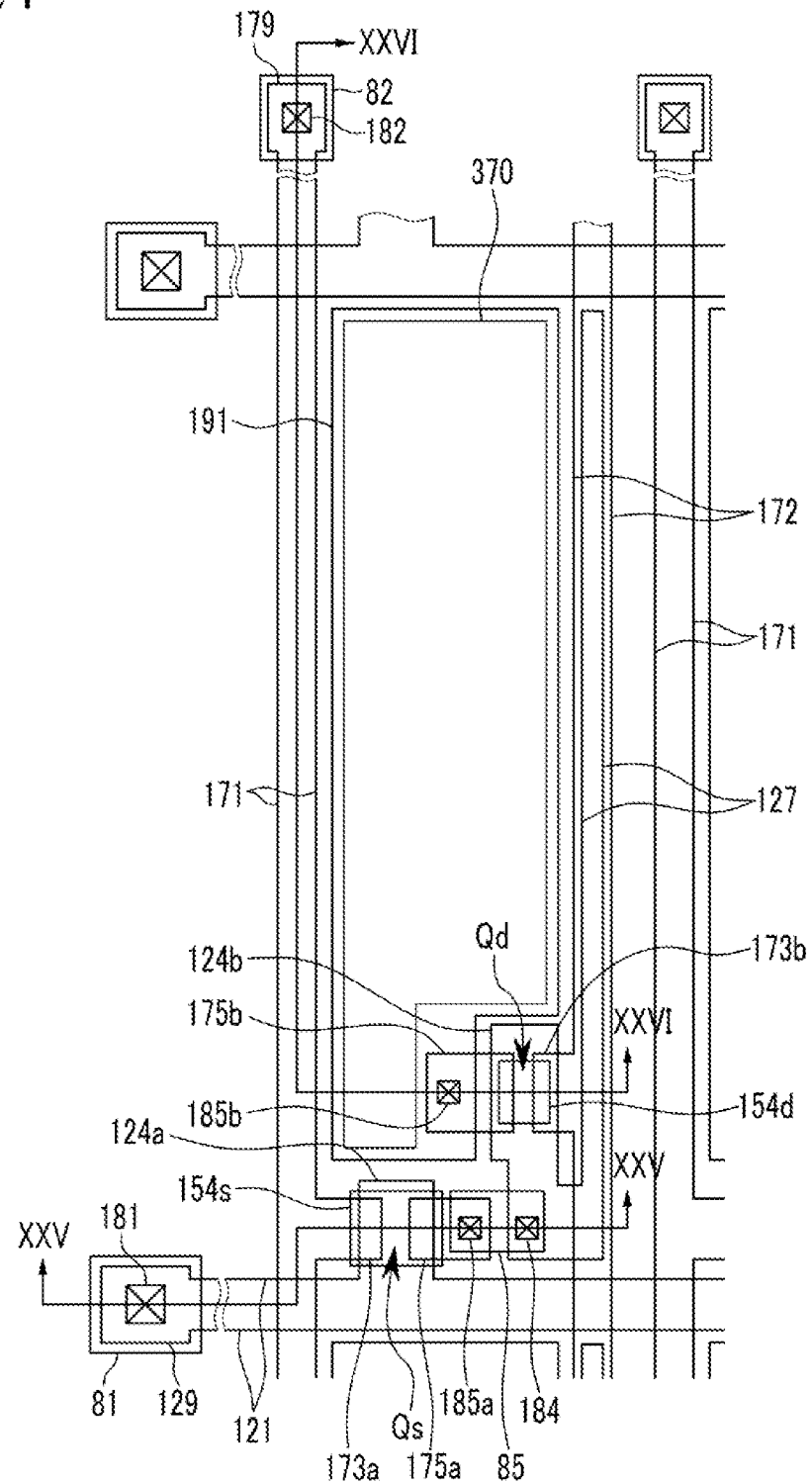
FIG. 24 is a layout view of a display device according to an exemplary embodiment of the present disclosure.
Figure 25:
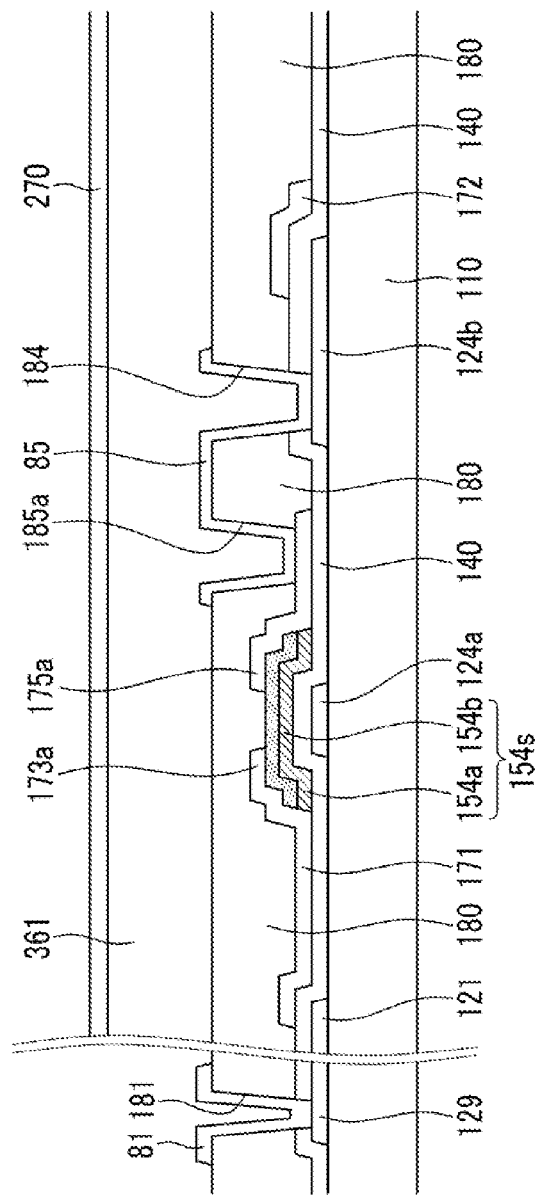
FIG. 25 is a cross-sectional view of the display device of FIG. 24 taken along the line XXV-XXV.
Figure 26:
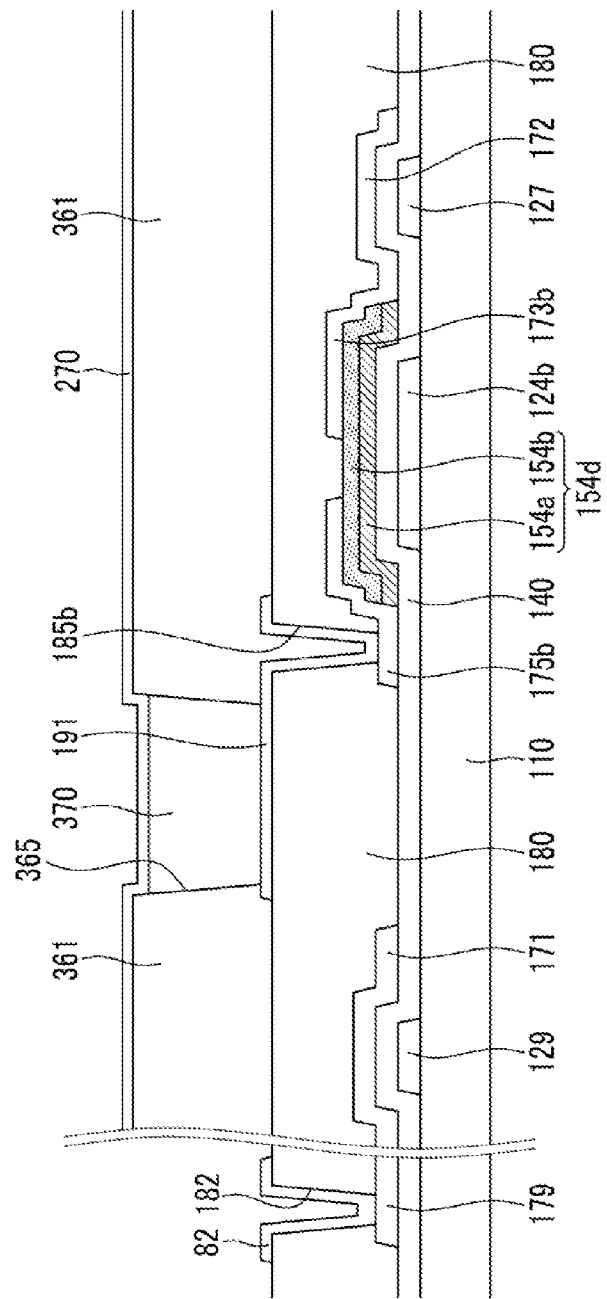
FIG. 26 is a cross-sectional view of the display device of FIG. 24 taken along the line XXVI-XXVI.

FIG. 23 is an equivalent circuit diagram of a OLED type display device according to an exemplary embodiment of the present disclosure, FIG. 24 is a layout view of a display device according to an exemplary embodiment of the present disclosure, FIG. 25 is a cross-sectional view of the display device of FIG. 24 taken along the line XXV-XXV, and FIG. 26 is a cross-sectional view of the display device of FIG. 24 taken along the line XXVI-XXVI.

In the present exemplary embodiment, an organic light emitting device (OLED) is provided as an example, however the thin film transistor according to an exemplary embodiment of the present disclosure may be applied to various other flat panel displays.

Firstly, referring to FIG. 23, an organic light emitting device according to the present exemplary embodiment includes a plurality of signal lines 121, 171, and 172, and a plurality of pixels PX connected thereto and arranged substantially in a matrix.

The signal lines include a plurality of gate lines 121 for transmitting gate signals (or scanning signals), a plurality of data lines 171 for transmitting data signals, and a plurality of driving voltage lines 172 for transmitting a driving voltage for powering turned-on ones of the light emitters (LD).

Each pixel PX includes a switching transistor Qs, a driving transistor Qd, a storage capacitor Cst, and an organic light emitting element LD.

The switching transistor Qs includes a control terminal (gate), an input terminal (source), and an output terminal (drain), in which the control terminal is connected to the gate line 121, the input terminal is connected to the data line 171, and the output terminal is connected to the driving transistor Qd. The switching transistor Qs transmits a data signal received from the data line 171 to the driving transistor Qd in response to the scanning signal received from the gate line 121.

The driving transistor Qd also includes a control terminal, an input terminal, and an output terminal, in which the control terminal is connected to the switching transistor Qs, the input terminal is connected to the driving voltage line 172, and the output terminal is connected to the organic light emitting element LD. The driving transistor Qd applies an output current ILD whose magnitude varies according to the voltage applied between the control terminal and the output terminal (which voltage may be stored by storage capacitor Cst).

The capacitor Cst is connected between the control terminal and the input terminal of the driving transistor Qd. The capacitor Cst stores the data signal applied to the control terminal of the driving transistor Qd, and maintains the stored data signal even after the switching transistor Qs is turned off.

The organic light emitting element LD is an organic light emitting diode (OLED), for example having an anode connected to the output terminal of the driving transistor Qd and a cathode connected to a common voltage Vss. The organic light emitting element LD emits a light whose intensity is varied according to the output current ILD of the driving transistor Qd, to thereby display an image. The organic light emitting element LD may include an organic material uniquely configured for emitting at least one of primary colors such as three primary colors of red, green, and blue, or a white color, and the organic light emitting device emits desired images by a spatial sum of the lights output by the pixels thereof.

Next, the detailed structure of the organic light emitting device shown in FIG. 23 will be described with reference to FIG. 24, FIG. 25, and FIG. 26.

A plurality of gate conductors including a plurality of gate lines 121 including a first control electrode 124a and a plurality of second control electrodes 124b including a storage electrode 127 are formed on an insulation substrate 110 made of a material such as transparent glass or plastic.

Each of the gate lines 121 includes a wide end 129 for connecting to another layer or an external driving circuit, and the first control electrode 124a upwardly extends from the gate line 121.

The second control electrode 124b is separated from the gate line 121 and includes a storage electrode 127 extending in the longitudinal direction.

A gate insulating layer 140 is formed on the gate conductor.

A plurality of switching semiconductive oxide regions 154s and a plurality of driving semiconductive oxide regions 154d are formed on the gate insulating layer 140. Each respective switching semiconductive oxide region 154s overlaps the first control electrode 124a, and each respective driving semiconductive oxide region 154d overlaps the second control electrode 124b. The switching semiconductive oxide regions 154s and the driving semiconductive oxide regions 154d respectively each include a corresponding first semiconductive element 154a and the second semiconductive element 154b including the semiconductive oxides, like those of the above-described several exemplary embodiments. The constitutions and the characteristics of the first semiconductive element 154a and the second semiconductive element 154b are substantially the same as those of the several exemplary embodiments such that the detailed description is omitted here.

A plurality of data conductors including a plurality of data lines 171, a plurality of driving voltage lines 172, and a plurality of first and second output electrodes 175a and 175b are formed on the switching semiconductive oxide regions 154s and the driving semiconductive oxide regions 154d.

Each data line 171 includes a plurality of first input electrodes 173a extending toward the first control electrode 124a and an end 179 having a wide area for connecting to another layer or an external driving circuit.

The driving voltage line 172 includes a plurality of second input electrodes 173b extending toward the second control electrode 124b, and may include a portion overlapping the storage electrode 127.

The first and second output electrodes 175a and 175b have island type shapes that are separated from each other, and may also be separated from the data line 171 and the driving voltage line 172. The first input electrode 173a and the first output electrode 175a face each other on the switching semiconductive oxide regions 154s, and the second input electrode 173b and the second output electrode 175b also face each other on the driving semiconductive oxide regions 154d.

The first control electrode 124a, the first input electrode 173a, and the first output electrode 175a form the switching transistor Qs along with the switching semiconductive oxide region 154s, and the channel of the switching transistor Qs is formed in the switching semiconductive oxide region 154s between the first input electrode 173a and the first output electrode 175a. The second control electrode 124b, the second input electrode 173b, and the second output electrode 175b form the driving transistor Qd along with the driving semiconductive oxide region 154d, and the channel of the driving transistor Qd is formed in the driving semiconductive oxide region 154d between the second input electrode 173b and the second output electrode 175b.

A passivation layer 180 made of an inorganic insulator such as a silicon nitride or a silicon oxide is formed on the gate insulating layer 140, the data conductor, and the exposed semiconductors 154s and 154d. The passivation layer 180 includes a contact hole 182 exposing the end 179 of the data line 171, a contact hole 185a exposing the first output electrode 175a, and a contact hole 185b exposing the second output electrode 175b.

The passivation layer 180 and the gate insulating layer 140 have a contact hole 184 exposing the second control electrode 124b and a contact hole 181 exposing the end 129 of the gate line 121.

A plurality of pixel electrodes 191, a plurality of connecting members 85 and a plurality of contact assistants 81 and 82 made of the conductive metal oxide such as ITO or IZO are formed on the passivation layer 180.

Each pixel electrode 191 is physically and electrically connected to the second output electrode 175b through the respective contact hole 185b.

The connecting member 85 connects the first output electrode 175a and the second control electrode 124b through the contact holes 185a and 184.

The contact assistants 81 and 82 are respectively connected to the end 129 of the gate line 121 and the end 179 of the data line through the contact holes 181 and 182. The contact assistants 81 and 82 compensate adhesion between the ends 179 and 129 of the data line 171 and the gate line 121 and protect them.

A partition 361 is formed on the passivation layer 180. The partition 361 surrounds the edges of the pixel electrodes 191 like a river bank, thereby defining a plurality of openings 365, and is made of an organic insulator or an inorganic insulator. The partition 361 may be made of a photoresist including a black pigment.

A plurality of organic light emitting members 370 are formed in the openings 365 that are formed on the pixel electrodes 191 defined by the partitions 361. Each organic light emitting member 370 is made of an organic material that emits a respective light of one of three primary colors (i.e., red, green, and blue), and may alternatively emit a white light.

An opposing electrode 270 is formed on the organic light emitting member 370. The opposing electrode 270 receives a common voltage Vss and may be made of a reflective metal such as calcium (Ca), barium (Ba), magnesium (Mg), silver (Ag), aluminum (Al), their alloys, etc., or a transparent conductive material such as ITO or IZO, etc.

In addition, the thin film transistor including the first semiconductive element 154a and the second semiconductive element 154b according to an exemplary embodiment of the present disclosure may have various structures, and may be applied to various other display panels and various other display devices. Also, the manufacturing method of the first semiconductive element 154a and the second semiconductive element 154b according to an exemplary embodiment of the present disclosure is not limited to the specific examples given, and may vary depending on various manufacturing methods and various process conditions.

While this disclosure has been described in connection with what are presently considered to be practical exemplary embodiments, it is to be understood that the disclosure is not limited to the disclosed embodiments, but, on the contrary, is intended to cover various modifications and equivalent arrangements included within the spirit and scope of the present teachings.

| <Description of Symbols> | |
|---|---|
| 3: | liquid crystal layer |
| 50: | photosensitive film |
| 81, 82: | contact assistants |
| 110, 210: | insulation substrate |
| 121: | gate line |
| 124: | gate electrode |
| 131: | storage electrode line |
| 140: | gate insulating layer |
| 154a, 154b: | semiconductive oxide |
| 155: | etch stopper |
| 170: | conductive layer |
| 174: | conductor layer |
| 171: | data line |
| 172: | driving voltage line |
| 173: | source electrode |
| 175: | drain electrode |
| 180: | passivation layer |
| 181, 182, 184, 185, 185a, 185b: | contact hole |
| 191: | pixel electrode |
| 200: | upper panel |
| 220: | light blocking member |
| 230: | color filter |
| 270: | opposing electrode |
| 370: | organic light emitting member |
| 361: | partition |

What is claimed is:

1. A semiconductive device comprising:
   a gate electrode;
   a gate insulating layer;
   a first semiconductive oxide layer comprising a first composition that includes a first semiconductive oxide;
   a second semiconductive oxide layer comprising a second composition that is different from the first composition and includes the first or a different second semiconductive oxide and that further includes at least one additional component that is not included in the first composition,
   where the first and second semiconductive oxide layers overlap with one another in a common overlapping region of both, where the gate electrode insulatively overlaps at least the common overlapping region, where the gate insulating layer is interposed between the gate electrode and the common overlapping region of the first and second semiconductive oxide layers;
   a source electrode connected to at least one of the first and second semiconductive oxide layers; and
   a drain electrode connected to the at least one of the first and second semiconductive oxide layers, the drain electrode being spaced apart from the source electrode, wherein the at least one additional component of the second composition includes at least one of gallium (Ga), silicon (Si), niobium (Nb), hafnium (Hf), and germanium (Ge),
wherein the first semiconductive oxide layer is interposed between the gate insulating layer and the second semiconductive oxide layer, and
a content of the additional component is in a range from about 1 at. % to about 30 at. % relative to the 100 atomic percent of the second composition.

2. The semiconductive device of claim 1, wherein the first semiconductive oxide is an indium(In)-zinc(Zn)-tin (Sn) oxide (IZTO), and the second semiconductive oxide is a zinc(Zn)-tin(Sn) oxide (ZTO).

3. The semiconductive device of claim 2, wherein
a difference between a respective content of tin (Sn) in the second composition and a respective content of tin (Sn) in the first composition is equal to or less than about 15 at. %.

4. The semiconductive device of claim 3, wherein
a respective thickness of each of the first second semiconductive oxide layers is respectively in a range from about 5 Å to about 600 Å.

5. The semiconductive device of claim 4, wherein
the second semiconductive oxide further includes indium (In).

6. The semiconductive device of claim 5, wherein
each of the source electrode and the drain electrode includes a layer of copper, and
each of the source electrode and the drain electrode directly contacts the second semiconductive oxide layer.

7. The semiconductive device of claim 1, wherein
the respective first and second compositions of the first and second semiconductive oxide layers are simultaneously etchable by a same predetermined etchant, and
a difference between etch rates of the first and second compositions when being etched by the predetermined etchant is equal to or less than about 100 Å/s (Angstroms per second).

8. The semiconductive device of claim 1, wherein
the first composition includes an indium(In)-zinc(Zn)-tin (Sn) oxide (IZTO), and
the second composition includes a zinc (Zn)-tin(Sn) oxide (ZTO).

9. The semiconductive device of claim 8, wherein
the respective first and second compositions of the first and second semiconductive oxide layers are simultaneously etchable by a same predetermined etchant, and
a difference between etch rates of the first and second compositions when being etched by the predetermined etchant is equal to or less than about 100 Å/s (Angstroms per second).

10. The semiconductive device of claim 9, wherein
a difference between a respective content of tin (Sn) in the second composition and a respective content of tin (Sn) in the first composition is equal to or less than about 15 at. %.

11. The semiconductive device of claim 1, wherein
a respective thickness of each of the first and second semiconductive oxide layers is respectively in a range from about 5 Å to about 600 Å.

12. The semiconductive device of claim 1, wherein
a difference between a respective content of tin (Sn) in the second composition and a respective content of tin (Sn) in the first composition is equal to or less than about 15 at. %.

13. The semiconductive device of claim 1, wherein
the second semiconductive oxide further includes indium (In).

14. The semiconductive device of claim 1, wherein
each of the source electrode and the drain electrode includes a layer of copper, and
each of the source electrode and the drain electrode directly contacts the second semiconductive oxide layer.

15. A thin film transistor array panel comprising:
a substrate;
a gate electrode disposed on the substrate;
a gate insulating layer insulating the gate electrode;
a first semiconductive oxide layer and a second semiconductive oxide layer that both overlap the gate electrode and are insulated from the gate electrode by the gate insulating layer, the first and second semiconductive oxide layers being electrically connected to each other;
a source electrode connected to the second semiconductive oxide layer;
a drain electrode connected to the second semiconductive oxide layer and being spaced apart from the source electrode; and
a pixel electrode connected to the drain electrode,
wherein the second semiconductive oxide layer includes in operationally effective concentration at least one additional element not included in the first semiconductive oxide layer,
the at least one additional element is one of gallium (Ga), silicon (Si), niobium (Nb), hafnium (Hf), and germanium (Ge),
wherein the first semiconductive oxide layer is interposed between the gate insulating layer and the second semiconductive oxide layer, and
a content of the additional element is in a range from about 1 at. % to about 30 at. % relative to the 100 atomic percent composition of the second semiconductive oxide layer.

16. The thin film transistor array panel of claim 15, wherein
the first semiconductive oxide layer includes an indium (In)-zinc(Zn)-tin(Sn) oxide (IZTO), and
the second semiconductive oxide layer includes a zinc (Zn)-tin(Sn) oxide (ZTO).

17. The thin film transistor array panel of claim 16, wherein
the respective compositions of the first semiconductive oxide layer and of the second semiconductive oxide layer are simultaneously etchable by a same predetermined etchant, and
a difference between etch rates of the respective compositions of the first and second semiconductive oxide layers when being etched by the predetermined etchant is equal to or less than about 100 Å/s (Angstroms per second).

18. The thin film transistor array panel of claim 17, wherein
a difference between a respective content of tin (Sn) of the second semiconductive oxide layer and a respective content of tin (Sn) of the first semiconductive oxide layer is equal to or less than about 15 at. %.

19. The thin film transistor array panel of claim 18, wherein
a respective thickness of each of the first semiconductive oxide layer and of the second semiconductive oxide layer is respectively in a range from about 5 Å to about 600 Å.

20. The thin film transistor array panel of claim 19, wherein
the second semiconductive oxide layer includes indium (In).

21. The thin film transistor array panel of claim 20, wherein
the source electrode and the drain electrode include a single layer of copper, and the source electrode and the drain electrode directly contact the second semiconductive oxide layer.

22. The semiconductive device of claim 19, wherein
the first semiconductive oxide is an indium(In)-zinc(Zn)-tin(Sn) oxide (IZTO), and
the second semiconductive oxide is a zinc(Zn)-tin(Sn) oxide (ZTO).

23. The thin film transistor array panel of claim 15, wherein
the respective compositions of the first semiconductive oxide layer and of the second semiconductive oxide layer are simultaneously etchable by a same predetermined etchant, and
a difference between etch rates of the respective compositions of the first and second semiconductive oxide layers when being etched by the predetermined etchant is equal to or less than about 100 Å/s (Angstroms per second).

24. The thin film transistor array panel of claim 23, wherein
a difference between a content of tin (Sn) of the second semiconductive oxide layer and a content of tin (Sn) of the first semiconductive oxide layer is equal to or less than about 15 at. %.

25. The thin film transistor array panel of claim 15, wherein
a respective thickness of each of the first semiconductive oxide layer and the second semiconductive oxide layer is respectively in a range from about 5 Å to about 600 Å.

26. The thin film transistor array panel of claim 15, wherein
a difference between a content of tin (Sn) of the second semiconductive oxide layer and a content of tin (Sn) of the first semiconductive oxide layer is equal to or less than about 15 at. %.

27. The thin film transistor array panel of claim 15, wherein
the second semiconductive oxide layer includes indium (In).

28. The thin film transistor array panel of claim 15, wherein
the source electrode and the drain electrode include a single layer of copper, and
the source electrode and the drain electrode directly contact the second semiconductive oxide layer.

29. A display device comprising:
a substrate;
a gate electrode positioned on the substrate;
a gate insulating layer positioned on or under the gate electrode;
a first semiconductive oxide and a second semiconductive oxide that both insulatively overlap with the gate electrode and contact each other;
a source electrode connected to the second semiconductive oxide;
a drain electrode connected to the second semiconductive oxide; and
a pixel electrode connected to the drain electrode,
wherein the second semiconductive oxide includes at least one additional element that is not included in the first semiconductive oxide,
the at least one additional element is one of gallium (Ga), silicon (Si), niobium (Nb), hafnium (Hf), and germanium (Ge),
wherein the first semiconductive oxide layer is interposed between the gate insulating layer and the second semiconductive oxide layer, and
a content of the at least one additional element is in a range from about 1 at. % to about 30 at. % of the content of the second semiconductive oxide.

30. The display device of claim 29, wherein
the first semiconductive oxide includes an indium(In)-zinc(Zn)-tin(Sn) oxide (IZTO), and
the second semiconductive oxide a zinc(Zn)-tin(Sn) oxide (ZTO).

31. The display device of claim 30, wherein
the first semiconductive oxide and the second semiconductive oxide are capable of being simultaneously etched by a predetermined etchant, and
a difference between respective etch rates of the first semiconductive oxide and the second semiconductive oxide when being etched by the predetermined etchant is equal to or less than about 100 Å/s.

32. The display device of claim 31, wherein
a difference between a content of tin (Sn) of the second semiconductive oxide and a content of tin (Sn) of the first semiconductive oxide is equal to or less than about 15 at. %.

33. The display device of claim 32, wherein
the first and second semiconductive oxides are each in the form of a respective layer; and
a respective thickness of the respective layer of each of the first semiconductive oxides is in a range from about 5 Å to about 600 Å.

34. The display device of claim 33, wherein
the second semiconductive oxide includes indium (In).

35. The display device of claim 34, wherein
the source electrode and the drain electrode include a single layer of copper, and
the source electrode and the drain electrode directly contact the second semiconductive oxide.

36. The display device of claim 29, wherein
the first semiconductive oxide includes an indium(In)-zinc(Zn)-tin(Sn) oxide (IZTO), and
the second semiconductive oxide includes a zinc(Zn)-tin(Sn) oxide (ZTO).

37. The display device of claim 29, wherein
the first and second semiconductive oxides are each capable of being etched by a same predetermined etchant, and
a difference between respective etch rates of the first second semiconductive oxides when being etched by the predetermined etchant is equal to or less than about 100 Å/s.

38. The display device of claim 37, wherein
a difference between a content of tin (Sn) of the second semiconductive oxide and a content of tin (Sn) of the first semiconductive oxide is equal to or less than about 15 at. %.

39. The display device of claim 29, wherein
a thickness of each of the first semiconductive oxide and the second semiconductive oxide is in a range from about 5 Å to about 600 Å.

40. The display device of claim 29, wherein
a difference between a content of tin (Sn) of the second semiconductive oxide and a content of tin (Sn) of the first semiconductive oxide is equal to or less than about 15 at. %.

41. The display device of claim 29, wherein
the second semiconductive oxide includes indium (In).

42. The display device of claim 29, wherein
the source electrode and the drain electrode include a single layer of copper, and
the source electrode and the drain electrode directly contact the second semiconductive oxide layer.

* * * * *

UNITED STATES PATENT AND TRADEMARK OFFICE
Certificate

Patent No. 8,686,426 B2                                                                  Patented: April 1, 2014

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Byung Du Ahn, Hwaseong-si (KR); Ji Hun Lim, Goyang-si (KR); Gun Hee Kim, Hwaseong-si (KR); Kyoung Won Lee, Ansan-si (KR); Je Hun Lee, Seoul (KR); Hiroshi Goto, Kobe-shi (JP); Aya Miki, Kobe-shi (JP); Shinya Morita, Kobe-shi (JP); and Toshihiro Kygimiya, Kobe-shi (JP).

Signed and Sealed this Nineteenth Day of August 2014.

DAVIENNE MONBLEAU
*Supervisory Patent Examiner*
Art Unit 2826
Technology Center 2800